(12) United States Patent
Snaith et al.

(10) Patent No.: US 11,387,050 B2
(45) Date of Patent: Jul. 12, 2022

(54) DEVICE ARCHITECTURE

(71) Applicant: OXFORD UNIVERSITY INNOVATION LIMITED, Oxford (GB)

(72) Inventors: Henry James Snaith, Oxford (GB); Tomas Leijtens, Oxford (GB); Jack Alexander-Webber, Oxford (GB); Maximillian Tobias Hoerantner, Oxford (GB)

(73) Assignee: OXFORD UNIVERSITY INNOVATION LIMITED, Botley (GB)

( * ) Notice: Subject to any disclaimer, the term of this patent is extended or adjusted under 35 U.S.C. 154(b) by 36 days.

(21) Appl. No.: 15/765,607

(22) PCT Filed: Oct. 5, 2016

(86) PCT No.: PCT/GB2016/053100
§ 371 (c)(1),
(2) Date: Apr. 3, 2018

(87) PCT Pub. No.: WO2017/060700
PCT Pub. Date: Apr. 13, 2017

(65) Prior Publication Data
US 2018/0286596 A1    Oct. 4, 2018

(30) Foreign Application Priority Data
Oct. 6, 2015    (GB) .................................... 1517629

(51) Int. Cl.
*H01L 51/00* (2006.01)
*H01G 9/20* (2006.01)
(Continued)

(52) U.S. Cl.
CPC ....... *H01G 9/2059* (2013.01); *H01L 51/0023* (2013.01); *H01L 51/0032* (2013.01);
(Continued)

(58) Field of Classification Search
CPC .............. H01G 9/2059; H01L 51/5221; H01L 51/4273; H01L 51/5012; H01L 51/5096;
(Continued)

(56) References Cited

U.S. PATENT DOCUMENTS 3,549,368 A * 12/1970 Deverse ................ G03F 7/0751
430/272.1
4,202,914 A * 5/1980 Havas .................. H01L 21/0272
204/192.26
(Continued)

FOREIGN PATENT DOCUMENTS

WO    2009008674 A2    1/2009
WO    2010060154 A1    6/2010
(Continued)

OTHER PUBLICATIONS

Ball, et al., Low-Temperature Processed Meso-Superstructured to Thin-Film Perovskite Solar Cells, Energy & Environmental Science, 2013, 6:1739-1743.
(Continued)

*Primary Examiner* — Michael Y Sun
(74) *Attorney, Agent, or Firm* — Quarles & Brady LLP

(57) ABSTRACT

The present invention relates to an optoelectronic device comprising: (a) a substrate comprising at least one first electrode, which at least one first electrode comprises a first electrode material, and at least one second electrode, which at least one second electrode comprises a second electrode material; and (b) a photoactive material disposed on the substrate, which photoactive material is in contact with the at least one first electrode and the at least one second
(Continued)

electrode, wherein the substrate comprises: a layer of the first electrode material; and, disposed on the layer of the first electrode material, a layer of an insulating material, which layer of an insulating material partially covers the layer of the first electrode material; and, disposed on the layer of the insulating material, the second electrode material, and wherein the photoactive material comprises a crystalline compound, which crystalline compound comprises: one or more first cations selected from metal or metalloid cations; one or more second cations selected from $Cs^+$ $RB^+$, $K^+$, $NH^4+$ and organic cations; and one or more halide or chalcogenide anions. A substrate comprising a first and second electrode and processes are also described.

7 Claims, 14 Drawing Sheets

(51) Int. Cl.
H01L 51/44 (2006.01)
H01L 51/42 (2006.01)
H01L 51/50 (2006.01)
H01L 51/52 (2006.01)
H01L 21/3213 (2006.01)
H01L 21/28 (2006.01)
H01L 21/48 (2006.01)
H01L 21/768 (2006.01)
H01L 21/311 (2006.01)
H01L 39/24 (2006.01)
H01L 31/0463 (2014.01)
H01L 49/02 (2006.01)

(52) U.S. Cl.
CPC ...... *H01L 51/0077* (2013.01); *H01L 51/0096* (2013.01); *H01L 51/4226* (2013.01); *H01L 51/4273* (2013.01); *H01L 51/442* (2013.01); *H01L 51/5012* (2013.01); *H01L 51/5096* (2013.01); *H01L 51/5206* (2013.01); *H01L 51/5221* (2013.01); *H01L 21/28* (2013.01); *H01L 21/311* (2013.01); *H01L 21/3213* (2013.01); *H01L 21/4828* (2013.01); *H01L 21/76816* (2013.01); *H01L 21/76892* (2013.01); *H01L 28/88* (2013.01); *H01L 28/92* (2013.01); *H01L 31/0463* (2014.12); *H01L 39/247* (2013.01); *H01L 39/2467* (2013.01); *H01L 51/006* (2013.01); *H01L 51/0056* (2013.01); *H01L 2224/0362* (2013.01); *H01L 2224/0363* (2013.01); *H01L 2224/03632* (2013.01); *H01L 2251/305* (2013.01); *Y02E 10/549* (2013.01)

(58) Field of Classification Search
CPC ............. H01L 51/5206; H01L 51/0077; H01L 51/0032; H01L 51/442; H01L 51/0023; H01L 51/4226; H01L 51/0096; H01L 51/0056; H01L 51/006; H01L 2251/305; H01L 21/28; H01L 21/311; H01L 21/3213; H01L 21/4828; H01L 21/76816; H01L 21/76892; H01L 28/88; H01L 28/92; H01L 31/0463; H01L 39/2467; H01L 39/247; H01L 2224/0362; H01L 2224/0363; H01L 2224/03632; Y02E 10/549; Y02E 10/542
See application file for complete search history.

(56) References Cited

U.S. PATENT DOCUMENTS

| | | | |
|---|---|---|---|
| 4,461,071 A * | 7/1984 | Poleshuk | H01L 27/1214 438/158 |
| 4,478,879 A | 10/1984 | Baraona et al. | |
| 4,650,984 A | 3/1987 | Furushima et al. | |
| 4,732,858 A * | 3/1988 | Brewer | G03F 7/0751 430/272.1 |
| 4,927,770 A | 5/1990 | Swanson | |
| 2005/0048414 A1 | 3/2005 | Harnack et al. | |
| 2006/0214156 A1* | 9/2006 | Pan | B82Y 10/00 257/40 |
| 2009/0059676 A1* | 3/2009 | Lai | G11C 8/10 365/185.28 |
| 2009/0215222 A1* | 8/2009 | Arai | H01L 29/7869 438/99 |
| 2009/0223562 A1 | 9/2009 | Niira et al. | |
| 2010/0078628 A1 | 4/2010 | Chi et al. | |
| 2011/0308599 A1 | 12/2011 | Stangl | |
| 2013/0134291 A1 | 5/2013 | Le Gette et al. | |
| 2013/0306948 A1* | 11/2013 | Yamazaki | H01L 27/156 257/40 |
| 2014/0197509 A1* | 7/2014 | Haddad | H01L 27/14629 257/432 |
| 2015/0123094 A1 | 5/2015 | Kang | |
| 2015/0287843 A1* | 10/2015 | Cheng | H01L 31/02167 136/256 |

FOREIGN PATENT DOCUMENTS

| | | |
|---|---|---|
| WO | 2015084961 A1 | 6/2015 |
| WO | 2016038825 A1 | 3/2016 |

OTHER PUBLICATIONS

Briseno, et al., Oligo- and Polythiophene/ZnO Hybrid Nanowire Solar Cells, Nano Letters, 2010, 10:334-340.
Docampo, et al., Efficient Organometal Trihalide Perovskite Planar-Heterojunction Solar Cells on Flexbile Polymer Substrates, Nature Communications, 2013, 4:2761, 6 pages.
Fu, et al., Dye-Sensitized Back-Contact Solar Cells, Advanced Materials, 2010, 22:4270-4274.
Jeon, et al., Solvent Engineering for High-Performance Inorganic-Organic Hybrid Perovskite Solar Cells, Nature Materials, 2014, 13:897-903.
Kim, H., et al., Lead Iodide Perovskite Sensitized All-Solid-State Submicron Thin Film Mesoscopic Solar Cell with Efficiency Exceeding 9%, Scientific Reports, 2012, 2:591, 7 pages.
Kim, M., et al., Lateral Organic Solar Cells with Self-Assembled Semiconductor Nanowires, Advanced Energy Materials, 2014, 1401317, 8 pages.
Korte, et al., Advances in a-Si:H/c-Si Heterojunction Solar Cell Fabrication and Characterization, Solar Energy Materials & Solar Cells, 2009, 93:905-910.
Lammert, et al., The Interdigitated Back Contact Solar Cell: A Silicon Solar Cell for Use in Concentrated Sunlight, IEEE Transactions on Electron Devices, 1977, 24(4):337-342.
Lee, et al., Efficient Hybrid Solar Cells Based on Meso-Superstructured Organometal Halide Perovskites, Science, 2012, 1228604, 6 pages.
Lombardo, et al., Electrical Characteristics of Lateral Organic Bulk Heterojunction Device Structures, Organic Electronics, 2012, 13:1185-1191.
Lombardo, et al., Device Physics and Operation of Lateral Bulk Heterojunction Devices, Journal of Physical Chemistry B, 2013, 117:4503-4509.
Lu, et al., Interdigitated Back Contact Silicon Heterojunction Solar Cell and the Effect of Front Surface Passivation, Applied Physics Letters, 2007, 91, 063507, 3 pages.
Malinkiewicz, et al., Perovskite Solar Cells Employing Organic Charge-Transport Layers, Nature Photonics, 2014, 8:128-132.

(56) References Cited

OTHER PUBLICATIONS

Ooi, et al., Analysis of Photocurrents in Lateral-Geometry Organic Bulk Heterojunction Devices, Applied Physics Letters, 2012, 101:053301, 5 pages.

Rouquerol, et al., Recommendations for the Characterization of Porous Solids, Pure & Applied Chemistry, 1994, 56(8):1739-1758.

Shaw, et al., Exciton Diffusion Measurements in Poly(3-hexylthiophene), Advanced Materials, 2008, 20:3516-3520.

Stangl, et al., Planar Rear Emitter Back Contact Silicon Heterojunction Solar Cells, Solar Energy Materials & Solar Dells, 2009, 93:1900-1903.

Stranks, et al., Electron-Hole Diffusion Lengths Exceeding 1 Micrometer in an Organometal Trihalide Perovskite Absorber, Science, 2013, 342:341-344.

Van Kerschaver, et al., Back-Contact Solar Cells: A Review, Progress in Photovoltaics: Research and Applications, 2006, 14:107-123.

Xiao, et al., Giant Switchable Photovoltaic Effect in Organometal Trihalide Perovskite Devices, Nature Materials, 2015, 14:193-198.

Zhang, et al., Charge Selective Contacts, Mobile Ions and Anomalous Hysteresis in Organic-Inorganic Perovskite Solar Cells, Materials Horizons, 2015, 2:315-322.

Gratzel, The Light and Shade of Perovskite Solar Cells, Nature Materials, 2014, 13(9):838-842.

European Patent Office, Communication, Application No. 16781169.4, dated Jun. 2, 2020, 10 pages.

China National Intellectual Property Administration. First office action for application 201680058216.0, dated Jun. 23, 2021. With translation. 28 pages.

Guarnieri, V., et al. "Platinum metallization for MEMS application: Focus on coating adhesion for biomedical applications." Biomatter 4:1 (2014): e28822, 7 pages.

IP Australia. Examination Report No. 3 for standard patent application 2016333740, dated Jan. 28, 2022. 5 pages.

IP Australia. Examination Report No. 4 for standard patent application 2016333740, dated Feb. 25, 2022. 5 pages.

Ramadan, K. S. E., et al. (2015). Low temperature reactive sputtering of thin aluminum nitride films on metallic nanocomposites. PloS ONE, 10(7), e0133479, 22 pages.

\* cited by examiner

DEVICE ARCHITECTURE

CROSS-REFERENCE TO RELATED APPLICATIONS

This application represents the national stage entry of PCT International Application No. PCT/GB2016/053100 filed Oct. 5, 2016, which claims priority to Great Britain Patent Application 1517629.0 filed Oct. 6, 2015, the contents of which are hereby incorporated herein by reference for all purposes.

FIELD OF THE INVENTION

The present invention relates to an optoelectronic device. Also described is a substrate comprising a first and second electrode. Processes according to the invention are also described.

The work leading to this invention has received funding from the European Research Council under the grant ERC-Stg 2011 HYPER.

BACKGROUND OF THE INVENTION

Organic-inorganic perovskite solar cells have risen to the forefront of research into photovoltaic energy solutions. The materials in the solar cells, other than the electrodes, can be solution processed and low cost, making them readily scalable for large-area applications.

In the standard device configuration, a slab of the perovskite (most commonly $CH_3NH_3PbI_3$) semiconductor is "sandwiched" between two carrier selective contacts. This is depicted schematically in FIG. 1, where titanium dioxide ($TiO_2$) is used as a hole blocking electron extraction layer and the organic small molecule Spiro-OMeTAD is used as the electron-blocking hole extraction layer. These layers are then contacted by a transparent conducting oxide (TCO, such as fluorine doped tin oxide (FTO)) and a deep work-function metal (such as silver or gold) on the bottom and top, respectively. In this configuration, the light passes through the TCO and the hole-blocking layer to reach the perovskite active layer. There are, however, non-negligible losses due to light reflection, scattering, and absorption through these layers, amounting to close to 15% of all light in the visible region of the solar spectrum (Ball, J. M.; Lee, M. M.; Hey, A.; Snaith, H. J. *Energy Environ. Sci.* 2013, 6, 1739). This means that the performance of the solar cell is limited to less than 90% of its theoretical maximum simply by the practical limitations of light harvesting. Moreover, this stack-like approach means that the solar cell processing involves several energy intensive steps with multiple deposition steps, using relatively large amounts of gold or silver in the solid top contact.

If the diffusion length of the material in question is relatively long, however, it can be possible to mitigate these problems by making long and thin contacts with large spaces between them. Here, the light transmission through this contact will be simply proportional to the effective area of non-contacted semiconductor. The high conductivity of metals makes it possible to make extremely narrow metal contacts on the order of 1 µm. If the diffusion length is tens of µm, a spacing of tens of um can be used, so that the effective area occupied by the electrode becomes negligible, and certainly less than the 15% that is lost in the standard TCO bottom contact arrangement. This is the design that is commonly used in commercially available silicon solar cells: many thin silver or aluminium electrodes are deposited on top of the p-type layer of the solar cell with mm spacing to make a conductive top electrode with high transparency (Korte, L.; Conrad, E.; Angermann, H.; Stangl, R.; Schmidt, M. *Sol. Energy Mater. Sol. Cells* 2009, 93, 905). Electron and hole diffusion lengths in perovskites can be over 1 µm (Stranks, et al. *Science* (80)) 2013, 342, 341)

On the other hand, if it were possible to place both of the selective contacts on the same bottom substrate, then the top surface of the semiconductor would be completely unshielded from the incoming irradiation. In fact, the top surface could then even be coated with an anti-reflective coating with an appropriate refractive index. Moreover, the back substrate which here contains both electron and hole selective contacts, can also still be close to transparent, making this architecture ideal for building integrated photovoltaics where solar panels double as windows. One way in which this could be carried out is by using interdigitated hole- and electron-selective contacts on the bottom substrate, for instance as described in U.S. Pat. No. 4,478,879 and Fu, D., Li Zhang, X., Barber, R. L & Bach, U. Dye-sensitized back-contact solar cells, *Adv. Mater.* 22, 4270-4274 (2010). This interdigitated back contact structure has also been theoretically described in relation to perovskites in WO 2015/084961, although there is no indication of how such devices might be constructed.

Furthermore, the interdigitated back electrode structure has proven difficult to use as the two selective contacts cannot touch as they will form a shorting path on the bottom substrate. This has prevented this type of electrode architecture from being readily applied to solution-processed photovoltaics such as metal halide perovskite solar cells. Furthermore, metal halide perovskite solar cells have relatively short electron-hole pair diffusion lengths compared with silicon which means they are less well suited to interdigitated back electrodes.

It is therefore desirable to develop a novel back electrode architecture suited for use in perovskite solar cells. It is also desirable to develop a new method for preparing such structures.

SUMMARY OF THE INVENTION

The inventors have developed a new optoelectronic device structure which surprisingly allows a back electrode structure to be used in an optoelectronic device comprising a metal halide perovskite photoactive material. The inventors have also found that the diffusion lengths measured in perovskite solar cells of up to 10 µm suggest that this type of architecture should be feasible for this new class of solar cell. The invention also surprisingly allows the preparation of a completely rear-contacted perovskite solar cell via a simple and scalable one-step lithographic patterning step. The architecture allows for improved light harvesting and hence ultimate limiting efficiency once fully optimised, while it also has direct benefits for simple processing and use in building integrated photovoltaics. A key merit of the invention is that in all areas of the rear contact substrate beneath the layer of metal halide perovskite there is either a p-type or an n-type collection material present on the substrate. This has the beneficial influence of predominantly leaving only one type of charge carrier (electrons or holes) with the requirement to travel laterally in the metal halide perovskite in the regions above the p-type or n-type charge collection layers.

The invention provides an optoelectronic device comprising:
  (a) a substrate comprising at least one first electrode, which at least one first electrode comprises a first electrode material, and at least one second electrode, which at least one second electrode comprises a second electrode material; and
  (b) a photoactive material disposed on the substrate, which photoactive material is in contact with the at least one first electrode and the at least one second electrode,
wherein the substrate comprises:
  a layer of the first electrode material; and,
  disposed on the layer of the first electrode material, a layer of an insulating material, which layer of an insulating material partially covers the layer of the first electrode material; and,
  disposed on the layer of the insulating material, the second electrode material,
and wherein the photoactive material comprises a crystalline compound, which crystalline compound comprises:
  one or more first cations selected from metal or metalloid cations;
  one or more second cations selected from $Cs^+$, $Rb^+$, $K^+$, $NH_4^+$ and organic cations; and
  one or more halide or chalogenide anions.

The invention also provides a substrate comprising at least one first electrode, which at least one first electrode comprises a first electrode material, and at least one second electrode, which at least one second electrode comprises a second electrode material;
  wherein the substrate comprises:
    a layer of the first electrode material; and,
    disposed on the layer of the first electrode material, a layer of an insulating material, which layer of an insulating material partially covers the layer of the first electrode material; and,
    disposed on the layer of the insulating material, the second electrode material;
and wherein the first electrode material comprises a transparent conducting oxide and/or an oxide of titanium, tin, zinc, niobium, tantalum, indium, gallium, neodymium, palladium or cadmium and the second electrode material comprises a metal.

Also provided by the invention is a process for producing a substrate comprising a first electrode and a second electrode, which process comprises:
  providing a layer of a first electrode material disposed on a layer of a base material;
  (ii) disposing on the layer of the first electrode material a layer of a resist;
  (iii) performing a lithography step to define a second electrode pattern on the layer of the first electrode material;
  (iv) disposing on the layer of resist a layer of an insulating material;
  (v) disposing on the layer of the insulating material a layer of a second electrode material; and
  (vi) removing the resist and the material disposed on the resist.

A substrate obtainable by a process for producing a substrate comprising a first electrode and a second electrode according to the invention is also provided.

A process for producing an optoelectronic device comprising a substrate comprising a first electrode and a second electrode, which process comprises a step of producing the substrate by a process of the invention is also provided.

Further provided by the invention is an optoelectronic device obtainable by a process for producing an optoelectronic device according to the invention.

Further provided by the invention is a module comprising two or more of the substrates according to the invention.

DETAILED DESCRIPTION OF THE INVENTION

Definitions

Figure 1:
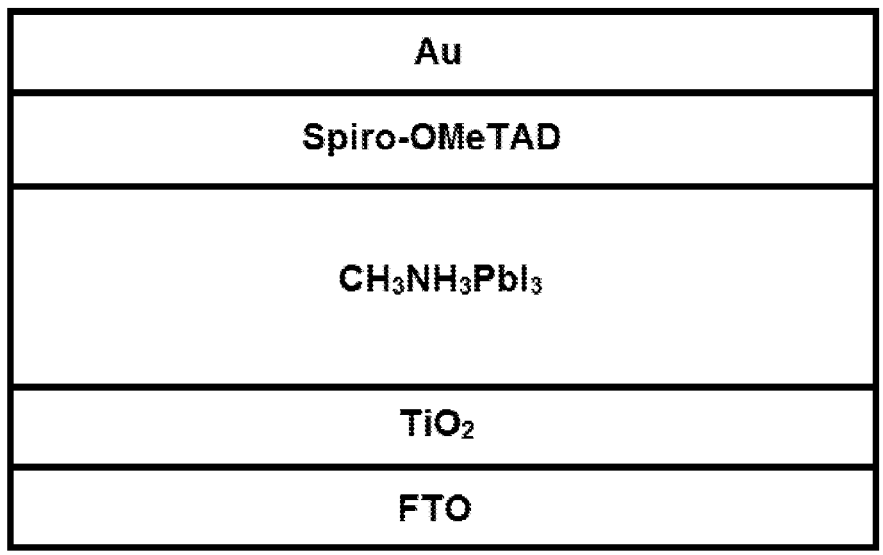
FIG. 1 shows a schematic of the standard perovskite solar cell architecture.

The term "photoactive material", as used herein, refers to a material which either (i) absorbs light, which may then generate free charge carriers; or (ii) accepts charge, both electrons and holes, which may subsequently recombine and emit light. A photoabsorbent material is a material which absorbs light, which may then generate free charge carriers (e.g electrons and holes). Photoactive materials are examples of semiconducting materials. A "photoemissive material" is a material which absorbs light of energies higher than band gap and reemits light at energies at the band gap The term "crystalline compound", as used herein, refers to a compound with a three-dimensional crystal structure which comprises two or more types of ions.

The term "monocation", as used herein, refers to any cation with a single positive charge, i.e. a cation of formula $A^+$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "trication", as used herein, refers to any cation with a triple positive charge, i.e. a cation of formula $A^{3+}$ where A is any moiety, for instance a metal atom.

The term "semiconductor" or "semiconducting material", as used herein, refers to a material with electrical conductivity intermediate in magnitude between that of a conductor and a dielectric. A semiconductor may be an negative (n)-type semiconductor, a positive (p)-type semiconductor or an intrinsic (i) semiconductor. A semiconductor may have a band gap of from 0.5 to 3.5 eV, for instance from 0.5 to 2.5 eV or from 1.0 to 2.0 eV (when measured at 300 K).

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di $(Ci_{1-10})$alkylamino, arylamino, diarylamino, aryl $(C_{1-10})$alkylamino, amido, acylamido, hydroxy, oxo, halo, carboxy, ester, acyl, acyloxy, $Ci_{1-10}$ alkoxy, aryloxy, halo $(C_{1-10})$ alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "porous", as used herein, refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width " (J. Rouquerol et al., "Recommendations for the Characterization of Porous Solids", Pure & Appl. Chem., Vol. 66, No. 8, pp.1739-1'758, 1994). The following distinctions and definitions were adopted in previous IUPAC documents (K.S.W. Sing, et al, Pure and Appl. Chem., vol. 57, n04, pp 603-919, 1985; and IUPAC "Manual on Catalyst Characterization", J. Haber, Pure and Appl. Chem., vol. 63, pp. 1227-1246, 1991): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity", as used herein, therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer", as used herein, refers to a layer without mesoporosity or macroporosity. A compact layer may sometimes have microporosity or nanoporosity.

The term "optoelectronic device", as used herein, refers to devices which source, control, detect or emit light. Light is understood to include any electromagnetic radiation. Examples of optoelectronic devices include photovoltaic devices, photodiodes (including solar cells), phototransistors, photomultipliers, photodetectors, photoresistors, light emitting devices, light emitting diodes and charge injection lasers.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

The term "layer", as used herein, refers to any structure which is substantially laminar in form (for instance extending substantially in two perpendicular directions, but limited in its extension in the third perpendicular direction). A layer may have a varying thickness. The shape of a layer when viewed in plan (e.g. in the third perpendicular direction) may be continuous and complete over a certain region, for instance a rectangular area, or may have regions which do contain the material forming the layer and regions which do not contain the material forming the layer. In the later case the layer may, for instance, comprise a plurality of narrow rectangular regions (i.e. strips) of the material making up the layer, which may for instance be connected by a further strip running perpendicular to form a comb-like layer of material. In some cases, a layer of a material may comprise a plurality of unconnected regions of the material provided these regions are all contained within a layer-like region. "Layer" is not restricted to single layers of a single material but includes any multi-layered system of one of more materials, provided that together the multi-layered system constitutes a layer.

Optoelectronic Device

The invention provides an optoelectronic device comprising:
  (a) a substrate comprising at least one first electrode, which at least one first electrode comprises a first electrode material, and at least one second electrode, which at least one second electrode comprises a second electrode material; and
  (b) a photoactive material disposed on the substrate, which photoactive material is in contact with the at least one first electrode and the at least one second electrode,
wherein the substrate comprises:
  a layer of the first electrode material; and,
  disposed on the layer of the first electrode material, a layer of an insulating material, which layer of an insulating material partially covers the layer of the first electrode material; and,
  disposed on the layer of the insulating material, the second electrode material,
and wherein the photoactive material comprises a crystalline compound, which crystalline compound comprises:
  one or more first cations selected from metal or metalloid cations;
  one or more second cations selected from $Cs^+$, $Rb^+$, $K^+$, $NH_4^+$ and organic cations; and
  one or more halide or chalcogenide anions.

Figure 9:
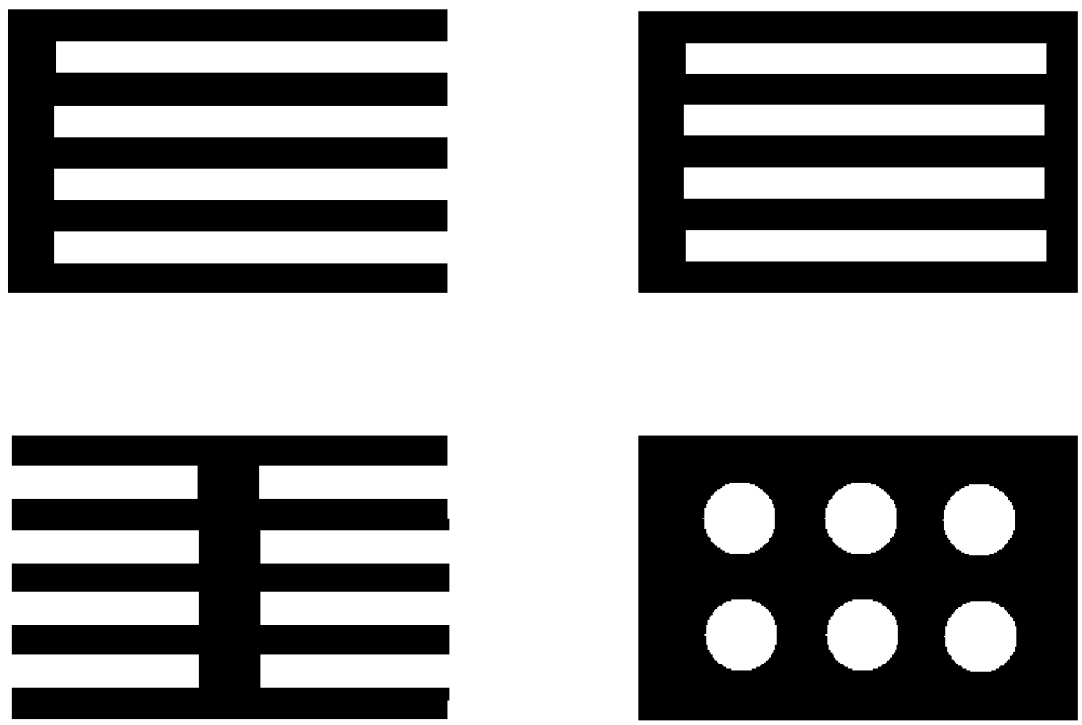
FIG. 9 shows schematic plan views of possible electrode patterns and coverage where white areas are exposed areas of the first electrode material and black areas correspond to the layer of the second electrode material.

The layer of an insulating material partially covers the layer of the first electrode material. Thus, when viewed in plan the area of the layer of an insulating material only partially covers the layer of the first electrode material. The layer of the first electrode material is typically a continuous and complete layer which extends over substantially all the substrate (or at least the part of the substrate which comprises the first and second electrodes). For instance, the layer of a first electrode material may be in the form of a complete substantially rectangular layer of the first electrode material. The layer of the insulating material is typically an incomplete layer which extends over only part of the substrate. For instance, the layer of the insulating material may be in the form of a comb-like structure disposed on the layer of the first electrode material. The layer of the insulating material may alternatively be a layer of the insulating material, which layer has a plurality of holes which may be substantially, rectangular, substantially circular or any other shape. Examples of the shapes which the layer of the insulating material may adopt are shown in FIG. 9.

The layer of an insulating material typically covers less than or equal to 80% of the area of the layer of the first electrode material when viewed in plan. Thus, if a rectangular layer of the first electrode material has an area of 10.0 $cm^2$ when viewed in plan (although not all of the first electrode material will be visible due to the layer of the insulating material) and the layer of the insulating material disposed thereon has an area of 7.0 cm² when viewed in plan, the insulating material covers 70% of the area of the layer of the first electrode material when viewed in plan. The layer of an insulating material often covers less than or equal to 70%, or less than or equal to 60%, of the area of the layer of the first electrode material when viewed in plan. The layer of an insulating material often covers greater than or equal to 20%, or greater than or equal to 30%, of the area of the layer of the first electrode material when viewed in plan. For instance, the layer of an insulating material may cover from 30% to 70% of the area of the layer of the first electrode material, for instance from 40% to 60%.

The layer of the second electrode material is disposed on the layer of the insulating material. The layer of the second electrode material is typically not disposed on the layer of the first electrode material. Thus, when viewed in plan the layer of the second electrode material also partially covers the layer of the first electrode material but it is substantially not in contact with the layer of the first electrode material. When viewed in plan, the layer of the second electrode material therefore typically covers an area less than or equal to the area covered by the layer of the insulating material. The layer of the second electrode material may in some cases cover an area greater than the area covered by the layer of the insulating material, but without the layer of the second electrode material contacting the layer of the first electrode material.

The layer of the second electrode material is often superimposed on the layer of the insulating material. Thus, the layer of the second electrode material and the layer of the insulating material typically have the substantially the same outline and are superimposed on each other. This is typically achieved by depositing the layer of the insulating material and the layer of the second electrode material in the same lithography step. The removal of the resist then leaves the same pattern of both the insulating material and the second electrode material.

One or more additional layers may be present between the layer of the first electrode material and the layer of the insulating material, or between the layer of the insulating material and the layer of the second electrode, if required. Typically, the layer of the insulating material is disposed directly on, and in contact with, the layer of the first electrode material. Typically, the layer of the second electrode material is disposed directly on, and in contact with, the layer of the insulating material. In some cases, a layer of an adhesive material (for instance chromium) may be disposed between the layer of the first electrode material and the layer of the insulating material, or between the layer of the insulating material and the layer of the second electrode.

The photoactive material typically has an electron-hole diffusion length of less than or equal to 80 µm. Often, the photoactive material typically has an electron-hole diffusion length of greater than or equal to 100 nm. For instance, the electron-hole diffusion length may be less than or equal to 50 µm or less then or equal to 10 µm. In some cases, the photoactive material typically has an electron-hole diffusion length of from 100 nm to 5 µm for instance from 500 nm to 1.5 µm. The electrons in electron-hole pairs may have an electron diffusion length of from 100 nm to 5 µm. The holes in electron-hole pairs may have an electron diffusion length of from 100 nm to 5 µm. Electron and hole diffusion lengths may be measured using known techniques, for instance those set out in Shaw et al, Adv. Mater. 20, 3516-3520 (2008) or in Stranks et al, Science 342, 341 (2013). The diffusion lengths are typically those as measured by modelling the photoluminescent decay of the photoactive material to a diffusion equation with and without a quenching layer. The measurements are typically done at 20° C.

In the crystalline compound, the one or more first cations are typically metal or metalloid cations selected from $Pd^{4+}$, $W^{4+}$, $Re^{4+}$, $Os^{4+}$, $IR^{4+}$, $Pt^{4+}$, $Sn^{4+}$, $Pb^{4+}$, $Ge^{4+}$, $Te^{4+}$, $Bi^{3+}$, $Sb^{3+}$, $Sn^{2+}$, $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Ag^+$ and $C^+$. The one or more first cations are preferably metal or metalloid dications selected from $Sn^{2+}$, $Pb^{2+}$, $Cu^{2+}$ and $Ge^{2+}$.

In the crystalline compound, the one or more second cations are typically one or more monocations selected from $Cs^+$, $Rb^+$, $K^+$ and organic monocations. For instance, the one or more second cations may be one or more organic monocations. Typically, the one or more second cations are the one or more organic monocations are selected from $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ are typically independently H, a substituted or unsubstituted $C_{1-6}$ alkyl group or a substituted or unsubstituted aryl group. Preferably $R^1$, $R^2$, $R^3$, $R^4$, $R^5$ and $R^6$ are independently H, or an unsubstituted $C_{1-6}$ alkyl group. For instance, $R^1$, $R^2$, $R^3$, $R^4$, $R^5$ and $R^6$ may independently be H, methyl, ethyl or propyl.

Preferably, the one or more second cations are selected from $(R^1NH_3)^+$, $(NR^2_4)^+$, and $(H_2N-C(R^1)=NH_2)^+$, wherein $R^1$ is H, a substituted or unsubstituted $C_{1-20}$ alkyl group or a substituted or unsubstituted aryl group, and each $R^2$ is independently H, or a substituted or unsubstituted $C_{1-10}$ alkyl group. Often, $R^1$ is H or an unsubstituted $C_{1-6}$ alkyl group and each $R^2$ is an unsubstituted $C_{1-6}$ alkyl group. For instance, $R^1$ may be H, methyl, ethyl or propyl and each $R^2$ may be methyl, ethyl and propyl. All $R^2$ may be the same and may be methyl, ethyl and propyl. For instance, the one or more second cations may be selected from $Cs^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$. Often, the one or more second cations are a single cation which is $(CH_3NH_3)^+$, $(CH_3CH_2NH_3)^+$ or $(CH_3CH_2CH_2NH_3)^+$. For instance, the second cation may be $(CH_3NH_3)^+$.

In the crystalline compound, the one or more anions are typically selected from $F^-$, $Cl^-$, $Br^-$, $I^-$, $Se^{2-}$, and $Te^{2-}$. Typically, the one or more anions are selected from $F^-$, $Cl^-$, $Br^-$ and $I^-$, for instance $Cl^-$, $Br^-$ and $I^-$.

Thus, the crystalline compound may be a compound having the formula

$$[A]_a[M]_b[X]_c$$

wherein [A] is said one or more second cations, [M] is said one or more first cations, [X] is one or more halide or chalcogenide anions, a is an integer from 1 to 6, b is an integer from 1 to 6, and c is an integer from 1 to 18. a is often an integer from 1 to 3, b is often an integer from 1 to 3, and c is often an integer from 1 to 8.

If [A] is one cation (A), [M] is two cations ($M^1$ and $M^2$), and [X] is one anion (X), the crystalline material may comprise a compound of formula $A_a(M^1,M^2)_bX_c$. [A] may represent one, two or more A ions. If [A], [M] or [X] is more than one ion, those ions may be present in any proportion. For instance, $A_a(M^1,M^2)_bX_c$ includes all compounds of formula $A_aM^1_{by}M^2_{b(1-y)}X_c$ wherein y is between 0 and 1, for instance from 0.05 to 0.95. Such materials may be referred to as mixed ion materials.

Typically, the crystalline compound is a perovskite or a hexahalometallate. Preferably the crystalline compound is perovskite. The crystalline compound is often a metal halide perovskite. The crystalline compound is often an organometal halide perovskite.

Typically, the crystalline compound is a perovskite of formula (I):

$$[A][M][X]_3 \quad (I)$$

wherein: [A] is said one or more second cations, [M] is said one or more first cations, [X] is one or more halide or chalcogenide anions.

[A] may be at least one cation as described herein for the second cation. For instance, [A] may be one or more cations selected from $Cs^+$, $(NR_1R^2R^3R^4)^+$, $(R^1R^2N-CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, and $R^6$ may be independently H, or an unsubstituted $C_{1-6}$ alkyl group. [A] may be one or more organic cations selected from $(CH_3NH_3)^+$, $(CH_3CH_2NH_3)^+$, $(CH_3CH_2CH_2NH_3)^+$, $(N(CH_3)_4)^+$, $(H_2N-C(CH_3)=NH_2)^+$ and $(H_2N-C(CH_3)=Nh_2)^+$. [A] may be a single cation selected from $(CH_3NH_3)^+$, $(CH_3CH_2NH_3)^+$, $(CH_3CH_2CH_2NH_3)^+$, $(N(CH_3)_4)^+$, $(H_2N-C(H)=NH_2)^+$ and $(H_2N-C(CH_3)=NH_2)^+$. A is often $(CH_3NH_3)^+$, $(CH_3CH_2NH_3)^+$ or $(CH_3CH_2CH_2NH_3)^+$.

[M] may be at least one cation as described herein for the first cation. For instance, [M] may be one or more cations selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$.

In one embodiment, the perovskite is a perovskite compound of the formula (IA):

$$AM[X]_3 \quad (IA)$$

wherein: A is one said second cation which is an organic cation; M is one said first cation which is a metal cation; and [X] is two or more different halide anions. Preferably, [X] is two or three different halide anions. More preferably, [X] is two different halide anions. The organic cation and metal cation may be as defined above for the second cation and first cation respectively.

The photoactive material may, for instance, comprise a perovskite compound of formula (IB):

$$AMX_{3-x}X'_x \quad (IB)$$

wherein: A is said second cation; M is said first cation; X is a first halide anion; X' is a second halide anion which is different from the first halide anion; and x is from 0 to 3. Usually, x is from 0.05 to 0.95. For instance, x may be from 0.5 to 2.5, or from 0.75 to 2.25. Typically, x is from 1 to 2.

The photoactive material may comprise, or consist essentially of, a perovskite compound selected from $APbI_3$, $APbBr_3$, $APbCl_3$, $APbF_3$, $APbBr_xI_{3-x}$, $APbBr_xCl_{3-x}$, $APbI_xBr_{3-x}$, $APbI_xCl_{3-x}$, $APbCl_xBr_{3-x}$, $APbI_{3-x}Cl_x$, $ASnI_3$, $ASnBr_3$, $ASnCl_3$, $ASnF_3$, $ASnBrI_2$, $ASnBr_xI_{3-x}$, $ASnBr_xCl_{3-x}$, $ASnF_{3-x}Br_x$, $ASnI_xBr_{3-x}$, $ASnI_xCl_{3-x}$, $ASnF_{3-x}I_x$, $ASnCl_xBr_{3-x}$, $ASnI_{3-x}Cl_x$ and $ASnF_{3-x}Cl_x$, $ACuI_3$, $ACuBr_3$, $ACuCl_3$, $ACuF_3$, $ACuBrI_2$, $ACuBr_xI_{3-x}$, $ACuBr_xCl_{3-x}$, $ACuF_{3-x}Br_x$, $ACuI_xBr_{3-x}$, $ACuI_xCl_{3-x}$, $ACuF_{3-1}I_x$, $ACuCl_xBr_{3-x}$, $ACuI_{3-x}Cl_x$, and $ACuF_{3-x}Cl_x$ where x is from 0 to 3, and wherein A is an organic cation as described herein or an ammonium cation. x may be from 0.05 to 2.96. For instance, x may be from 0.1 to 2.9, or from 0.5 to 2.5. In some cases, x is from 0.75 to 2.25, or from 1 to 2.

The photoactive material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xC_{3-x}$, $CH_3NH_3CuF_{3-x}I_x$, $CH_3NH_3CuCl_xBr_{3-x}$, $CH_3NH_3CuI_{3-x}Cl_x$, and $CH_3NH_3CuF_{3-x}Cl_x$ where x is from 0 to 3. x may be from 0.05 to 2.95. For instance, x may be from 0.1 to 2.9, or from 0.5 to 2.5. In some cases, x is from 0.75 to 2.25, or from 1 to 2. For instance, if the first cation is $Pb^{2+}$, the second cation is $CH_3NH_3^+$ and the second anion is r, then the crystalline material may comprise or consist essentially of $CH_3NH_3PbI_3$.

The photoactive material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

The photoactive material may comprise, or consist essentially of, a perovskite compound selected from $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnBr_xI_{3-x}$, $CH_3NH_3SnBr_xCl_{3-x}$, $CH_3NH_3SnF_{3-x}Br_x$, $CH_3NH_3\ SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_3,Cl_x$ and $CH_3NH_3SnF_{3-x}Cl_x$, where x is from 0.05 to 2.95. For instance, x may be from 0.5 to 2.5, from 0.75 to 2.25, or from 1 to 2.

Preferably, the photoactive material comprises, or consist essentially of, a perovskite compound selected from $CH_3NH_3PbI_3$, $CH_3NH_3SnI_3$, $NH_4CuCl_2Br$, $CH_3NH_3CuCl_3$, and $CH_3NH_3CuCl_2Br$.

In one embodiment, the crystalline compound is a compound (layered perovskite) of formula (II):

$$[A]_2[M][X]_4 \quad (II)$$

wherein: [A] is said one or more second cations, [M] is said one or more first cations which are one or more metal or metalloid dications, [X] is one or more halide or chalcogenide anions.

The photoactive material may comprise crystalline compound which is a hexahalometallate of formula (III):

$$[A]_2[M][X]_6 \quad (III)$$

wherein: [A] is said one or more second cations; [M] is said one or more first cations which are one or more metal or metalloid tetracations; and [X] one or more halide anion.

The hexahalometallate compound may, for instance, be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, $A_2SnBr_{6-y}I_y$, $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, $A_2TeBr_{6-y}I_y$, $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, $A_2GeBr_{6-y}I_y$, $A_2ReF_{6-y}Cl_y$, $A_2ReF_{6-y}Br_y$, $A_2ReF_{6-y}I_y$, $A_2ReCl_{6-y}Br_y$, $A_2ReCl_{6-y}I_y$ or $A_2ReBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-20}$ alkyl group; and y is from 0 to 6. Optionally, y is from 0.01 to 5.99. If the hexahalometallate compound is a mixed-halide compound, y is typically from 1.00 to 5.00. A may be as defined above. For instance, A may be Cs$^+$, NH$_4^+$, (CH$_3$NH$_3$)$^+$, (CH$_3$CH$_2$NH$_3$)$^+$, (N(CH$_3$)4)$^+$, (N(CH$_2$CH$_3$)4)$^+$, (H$_2$N—C(H)=NH$_2$)$^+$or (H$_2$N—C(CH$_3$)=NH$_2$)$^+$, for instance Cs$^+$, NH$_4^+$, or (CH$_3$NH$_3$)$^+$.

In some embodiments, all of the ions in the hexahalometallate are single anions. Thus, the photoactive material may comprise, or consist essentially of, a hexahalometallate compound of formula (IIIC)

$$A_2MX_6 \qquad (IIIC)$$

wherein: A is one of said second monocations; M is a metal or metalloid tetracation; and X is a halide anion. A, M and X may be as defined herein.

The hexahalometallate compound may be A$_2$SnF$_6$, A$_2$SnCl$_6$, A$_2$SnBr$_6$, A$_2$SnI$_6$, A$_2$TeF$_6$, A$_2$TeCl$_6$, A$_2$TeBr$_6$, A$_2$TeI$_6$, A$_2$GeF$_6$, A$_2$GeCl$_6$, A$_2$GeBr$_6$, A$_2$GeI$_6$, A$_2$ReF$_6$, A$_2$ReCl$_6$, A$_2$ReBr$_6$ or A$_2$ReI$_6$, wherein: A is K$^+$, Rb$^+$, Cs$^+$, (R$^1$NH$_3$)$^+$, (NR$^2_4$)$^+$, or (H$_2$N—C(R$^1$)=NH$_2$)$^+$, wherein R$^1$ is H, a substituted or unsubstituted C$_{1-20}$ alkyl group or a substituted or unsubstituted aryl group, and R$^2$ is a substituted or unsubstituted C$_{1-10}$ alkyl group.

Often, the photoactive material comprises a crystalline compound which is CH$_3$NH$_3$PbI$_3$, CH$_3$NH$_3$PbBr$_3$, CH$_3$NH$_3$PbCl$_3$, CH$_3$NH$_3$PbF$_3$, CH$_3$NH$_3$PbBr$_x$I$_{3-x}$, CH$_3$NH$_3$PbBr$_x$Cl$_{3-x}$, CH$_3$NH$_3$PbI$_x$Br$_{3-x}$, CH$_3$NH$_3$PbI$_x$Cl$_{3-x}$, CH$_3$NH$_3$PbCl$_x$Br$_{3-x}$, CH$_3$NH$_3$PbI$_{3-x}$Cl$_x$, CH$_3$NH$_3$SnI$_3$, CH$_3$NH$_3$SnBr$_3$, CH$_3$NH$_3$SnCl$_3$, CH$_3$NH$_3$SnF$_3$, CH$_3$NH$_3$SnBrI$_2$, CH$_3$NH$_3$SnBr$_x$I$_{3-x}$, CH$_3$NH$_3$SnBr$_x$Cl$_{3-x}$, CH$_3$NH$_3$SnF$_3$Br$_x$, CH$_3$NH$_3$SnI$_x$Br$_{3-x}$, CH$_3$NH$_3$SnI$_x$Cl$_{3-x}$, CH$_3$NH$_3$SnF$_{3-x}$I$_x$, CH$_3$NH$_3$SnCl$_x$Br$_{3-x}$, CH$_3$NH$_3$SnI$_{3-x}$Cl$_x$ and CH$_3$NH$_3$SnF$_{3-x}$Cl$_x$, CH$_3$NH$_3$CuI$_3$, CH$_3$NH$_3$CuBr$_3$, CH$_3$NH$_3$CuCl$_3$, CH$_3$NH$_3$CuF$_3$, CH$_3$NH$_3$CuBrI$_2$, CH$_3$NH$_3$CuBr$_x$I$_{3-x}$, CH$_3$NH$_3$CuBr$_x$Cl$_{3-x}$, CH$_3$NH$_3$CuF$_{3-x}$Br$_x$, CH$_3$NH$_3$CuI$_x$Br$_{3-x}$, CH$_3$NH$_3$CuI$_x$Cl$_{3-x}$, CH$_3$NH$_3$CuF$_{3-x}$I$_x$, CH$_3$NH$_3$CUCl$_x$Br$_{3-x}$, CH$_3$NH$_3$CUI$_{3-x}$Cl$_x$, or CH$_3$NH$_3$CuF$_{3-x}$Cl$_x$ where x is from 0 to 3. The photoactive material may for instance comprise greater than 95 wt % of one or more of these perovskites.

The first electrode material typically comprises a transparent conducting oxide or a metal. The bulk of the first electrode may be formed of a first electrode material which is a metal or a transparent conducting oxide (TCO). The first electrode material may comprise greater than or equal to 60 wt % of a transparent conducting oxide or a metal.

The first electrode material typically comprises: a transparent conducting oxide selected from: indium tin oxide (ITO); tin oxide doped with a metal selected from aluminium, copper, silver, gallium, magnesium, cadmium, indium, tin, scandium, yttrium, cobalt, manganese, chrome and boron; fluorine doped tin oxide (FTO); or zinc oxide doped with a metal selected from aluminium, copper, silver, gallium, magnesium, cadmium, indium, tin, scandium, yttrium, cobalt, manganese, chrome and boron; or a metal selected from titanium, aluminium, copper, silver, gold, nickel or platinum. Preferably, the first electrode material comprises a transparent conducting oxide selected ITO, FTO and aluminium doped zinc oxide (AZO). The first electrode material may comprise a layer of a transparent conducting electrode, for instance a layer of a transparent conducting electrode having a thickness of from 100 nm to 1000 nm.

The first electrode is typically an electron selective electrode (but may alternatively be a hole selective electrode as discussed below). The first electrode material therefore often further comprises an n-type semiconductor. For instance, the first electrode material may comprise a major part of a metal or transparent conducting oxide as a conductive part and a minor part of an n-type semiconductor as a electron selective part. For instance, the first electrode material may comprise a layer of a metal or transparent conducting oxide and, disposed thereon, a layer of an n-type semiconductor.

The first electrode material typically further comprises an n-type semiconductor selected from: oxides of titanium, tin, zinc, strontium, zirconium, niobium, tantalum, indium, gallium, neodymium, palladium and cadmium, optionally wherein the n-type semiconductor is titanium dioxide; chalcogenides, oxides and oxysulfides of cadmium, tin, zinc, lead and bismuth, optionally wherein the n-type semiconductor is selected from CdS, CdSe, ZnS, ZnSe, SnS, SnSe, PbS, PbSe, Bi$_2$S$_3$, Bi$_2$Se$_3$, ZnO$_{1-x}$S$_x$ and SnO$_{1-x}$S$_x$; n-type organic semiconductors, optionally wherein the n-type organic semiconductors are selected from C$_{60}$, C$_{70}$ and derivatives thereof, polyaromatic hydrocarbons and derivatives thereof, polymeric organic n-type semiconductors, polyfluorenes, polyarylenes, perylene-thiophene copolymers and polyfluorene-arylamine compolymers.

Examples of n-type semiconductors include a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped; an oxide of titanium, tin, zinc, niobium, tantalum, tungsten, indium, gallium, neodymium, palladium, or cadmium, or an oxide of a mixture of two or more of said metals; TiO$_2$, SnO$_2$, ZnO, Nb$_2$O$_5$, Ta$_2$O$_5$, WO$_3$, W$_2$O$_5$, In$_2$O$_3$, Ga$_2$O$_3$, Nd$_2$O$_3$, PbO, CdO, FeS$_2$, CdS, ZnS, SnS, BiS, SbS, or Cu$_2$ZnSnS$_4$; CdS, CdSe, ZnS, ZnSe, SnS, SnSe, PbS, PbSe, Bi$_2$S$_3$, Bi$_2$Se$_3$, ZnO$_{1-x}$S$_x$, SnO$_{1-x}$S$_x$; a selenide of cadmium, zinc, indium, or gallium or a selenide of a mixture of two or more of said metals; or a telluride of cadmium, zinc, cadmium or tin, or a telluride of a mixture of two or more of said metals; Cu(In,Ga)Se$_2$, CdTe; a fullerene or a fullerene derivative (for instance C$_{60}$ or Phenyl-C61-butyric acid methyl ester (PCBM)), an organic electron transporting material comprising perylene or a derivative thereof, or poly{ [N,N0-bis (2-octyldodecyl)-naphthalene- 1,4,5,8-bis(dicarb oximide)]-2,6-diyl]-alt-5, 50-(2,20-bithiophene)} (P(NDI2OD-T2)).

Examples of derivatives of C$_{60}$, C$_{70}$ include PC$_{61}$BM (Phenyl-C$_{61}$-butyric acid methyl ester), PC$_{71}$BM (Phenyl-C$_{71}$-butyric acid methyl ester) and ICBA (indene-C$_{60}$ bisadduct).

Preferably, the first electrode material comprises an n-type semiconductor which is TiO$_2$, SnO$_2$, ZnO, Nb$_2$O$_5$, Ta$_2$O$_5$, In$_2$O$_3$, Ga$_2$O$_3$, Nd$_2$O$_3$, PbO, CdO, FeS$_2$, CdS, ZnS, SnS, BiS, SbS, or Cu$_2$ZnSnS$_4$. For instance, the first electrode material may be TiO$_2$, SnO$_2$, ZnO, Nb$_2$O$_5$, or Ta$_2$O$_5$. Preferably, the n-type semiconductor is TiO$_2$.

The first electrode material may further comprise an electron collecting electrode material.

The first electrode material typically comprises a layer of an n-type semiconductor. Often, the first electrode comprises a compact layer of an n-type semiconductor. For instance, the first electrode may comprise a compact layer of an n-type semiconductor which is a metal oxide. The (compact) layer typically has a thickness of from 20 nm to 300 nm, for instance from 50 nm to 200 nm. Preferably, the first electrode comprises a compact layer of TiO$_2$. The first electrode material may alternatively, or additionally, comprises nanoparticles of an n-type semiconductor. The nanoparticles may have an average particle size of from 5 nm to 250 nm, preferably from 5 nm to 50 nm. The nanoparticles may comprise a metal oxide, a metal sulfide, a metal selenide or a metal oxysulfide, such as $TiO_2$, $SnO_2$, ZnO, $Nb_2O_5$, $Ta_2O_5$, CdS, CdSe, ZnS, ZnSe, SnS, SnSe, PbS, PbSe, $Bi_2S_3$, $Bi_2Se_3$, $ZnO_{1-x}S_x$, or $SnO_{1-x}S_x$. For instance, the first electrode material may comprise nanoparticles of $TiO_2$. The first electrode material may comprise nanoparticles of $SnO_2$.

Preferably, the first electrode material comprises: a transparent conducting oxide or a metal; and, disposed on the transparent conducting oxide or a metal, a layer of an n-type semiconductor. For instance, one or more first electrodes may comprise one or more layers of a transparent conducting oxide or a metal; and, disposed on the one or more layers of a transparent conducting oxide or a metal, a layer of an n-type semiconductor.

The first electrode material may comprise a layer of titanium and a layer of an n-type semiconductor which is $TiO_2$. The first electrode material may comprise a layer of aluminium and a layer of an n-type semiconductor which is $TiO_2$.

The second electrode material typically comprises a transparent conducting oxide or a metal.

The second electrode material typically comprises a transparent conducting oxide selected from: indium tin oxide (ITO); tin oxide doped with a metal selected from aluminium, copper, silver, gallium, magnesium, cadmium, indium, tin, scandium, yttrium, cobalt, manganese, chrome and boron; fluorine doped tin oxide (FTO); or zinc oxide doped with a metal selected from aluminium, copper, silver, gallium, magnesium, cadmium, indium, tin, scandium, yttrium, cobalt, manganese, chrome and boron or a metal selected from aluminium, copper, silver, gold, nickel or platinum. The second electrode material may comprise a layer of a metal having a thickness of from 50 nm to 300 nm, for instance from 80 nm to 200 nm.

Preferably, the second electrode material typically comprises a metal selected from aluminium, copper, silver, gold, nickel or platinum. More preferably, the second electrode material typically comprises a metal selected from silver, gold or platinum. The second electrode may comprise nickel.

The second electrode is typically a hole selective electrode (but may alternatively be an electron selective electrode as discussed below). The second electrode material therefore often further comprises a p-type semiconductor. For instance, the second electrode material may comprise a major part of a metal or transparent conducting oxide as a conductive part and a minor part of a p-type semiconductor as a hole selective part. For instance, the second electrode material may comprise a layer of a metal or transparent conducting oxide and, disposed thereon, a layer of a p-type semiconductor.

For instance, the second electrode material may further comprise a p-type semiconductor selected from: chalcogenides, oxides and oxysulfides of nickel, tungsten, molybdenum or copper; p-type organic semiconductors, optionally wherein the p-type organic semiconductors are selected from arylamine derivatives, thiophene derivatives, ethylene dioxythiophene, spiro-bifluorene compounds, spiro-OMeTAD, Spiro-TAD, poly-triarylamines, poly-triphenyl diamines and derivates thereof, TFB and PFB, optionally wherein the organic semiconductor is doped with oxidative agents; and metal halides and metal pseudohalides, optionally wherein the metal halides and metal pseudohalides are selected from copper thiocyanate and copper iodide. In some cases, the second electrode material may further comprise a p-type semiconductor which is nickel oxide (NiO).

Examples of p-type semiconductors include spiro-OMeTAD (2,2',7,7'-tetrakis-(N,N-di-p-methoxyphenylamine)9, 9'-spirobifluorene)); P3HT (poly(3-hexylthiophene)); PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]); PVK (poly(N-vinylcarbazole)); HTM-TFSI (1-hexyl-3-methylimidazolium bis(trifluoromethylsulfonyl) imide); Li-TFSI (lithium bis(trifluoromethanesulfonyl)imide); tBP (tert-butylpyridine); carbon nanotubes; a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl; m-MTDATA (4,4',4"-tris(methylphenylphenylamino)triphenylamine); MeOTPD (N,N,N',N'-tetrakis(4-methoxyphenyl)-benzidine); BP2T (5,5'-di(biphenyl-4-yl)-2,2'-bithiophene); Di-NPB (N,N'-Di-[(1-naphthyl)-N,Y-diphenyl]-1,1'-biphenyl)-4,4'-diamine), α-NPB (N,N'-di(naphthalen-1-yl-N,N'-diphenyl-benzidine), TNATA (4,4',4"-tris-(N-(naphthylen-2-yl)-N-phenylamine)triphenylamine), BPAPF (9,9-bis[4-(N,N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4-bis-(N,N-diphenylamino)-tetraphenyl), PEDOT:PSS; inorganic hole transporters such as an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type semiconductor may comprise PEDOT (poly(3,4-ethylenedioxythiophene)).

The p-type semiconductor may be doped, for instance with $NOBF_4$ (Nitrosonium tetrafluoroborate) or tertbutyl pyridine and LiTFSI for instance to increase the hole-density.

Typically, the second electrode material comprises: a transparent conducting oxide or a metal; and disposed on the transparent conducting oxide or a metal a layer of a p-type semiconductor. In such an arrangement, the TCO or metal acts as a conductor to carry current away from the photoactive material while the layer of a p-type semiconductor acts to collect holes and/or block electrons.

Thus, the second electrode material may comprise a layer of a metal and, disposed on the layer of a metal, a layer (or coating) of a p-type semiconductor. The second electrode material may comprise a layer of gold and a coating of an organic p-type semiconductor such as spiro-OMeTAD coated on the layer of gold.

In some cases, the second electrode may comprise a layer of a metal (for instance as a major component) and a layer of the oxide of that metal (for instance of the minor component). In such as case, the layer of the metal may function as the main electrically conductive part of the second electrode and the metal oxide may function as the selective part of the electrode, for instance a hole conduction layer of the electron conduction layer. For instance, the second electrode may comprise a layer of nickel and a layer of nickel oxide. Alternatively, typically in an inverted device, the second electrode may comprise a layer of titanium and a layer of titanium dioxide.

If the second electrode material comprises a layer of a metal and a layer of an n-type or p-type semiconductor, the layer of the n-type or p-type semiconductor is typically in contact with the photoactive material. The layer of the n-type or p-type semiconductor may form the entirety of the outer layer of the second electrode, i.e. the layer of the metal may be entirely coated with the layer of the n-type or p-type semiconductor. Alternatively, the layer of the n-type or p-type semiconductor may be disposed on a single surface of the layer of the metal.

For instance, if a section of the layer of the metal has a substantially rectangular cross section with one (lower) surface of the metal in contact with the layer of the insulating material, the layer of the n-type or p-type semiconductor may be (i) disposed on the three other surfaces of the metal and thereby coating the entire surface of the layer of the metal (as may occur if the layer of the n-type or p-type semiconductor is produced by oxidising the layer of the metal as described below) or (ii) disposed on only the one (upper) surface of the metal opposite the surface in contact with the layer of the insulating material and thereby leaving the remaining two surfaces of the layer of the metal uncoated with the layer of the n-type or p-type semiconductor (as may occur if the layer of the n-type or p-type semiconductor is deposited in a step subsequent to the deposition of the layer of the metal and before the removal of the layer of resist as described below).

In the case where the layer of the n-type or p-type semiconductor only partially covers the layer of the metal, the remaining exposed areas of the layer of metal may be further coated with a blocking layer, for instance a compound suitable for forming a self-assembled monolayer as described below.

In the first and/or second electrodes, the layer of the n-type or p-type semiconductor is typically from 3 to 100 nm, for instance from 5 to 30 nm.

Typically, the first electrode material is the electron collecting electrode and the second electrode material is the hole collecting electrode, as described above. However, in some embodiments, the first electrode material is the hole collecting electrode and the second electrode material is the electron collecting electrode. In that case, the first electrode material may be as described above for the second electrode material, and the second electrode material may be as described above for the first electrode material. Thus, the first electrode material may comprise a metal such as gold or platinum and a p-type semiconductor, and the second electrode material may comprise a metal or TCO and an n-type semiconductor such as titanium dioxide.

The insulating material is disposed between the layers of the first and second electrode materials. The insulating material therefore prevents the first electrode contacting the second electrode, which would otherwise create a short circuit.

The insulating material typically comprises a polymer or a dielectric inorganic material. The insulating material typically has a resistivity of greater than or equal to $10^4$ Ωm. The dielectric inorganic material typically has a band gap of greater than or equal to 3.5 eV or greater than or equal to 4.0 eV. The insulating material may be a dielectric inorganic material selected from an oxide of one or more of aluminium, zirconium, silicon, yttrium and ytterbium or a polymer selected from polyalkenes (for instance polystyrene or polyethene) and polyacrylates (for instance polymethylmethacrylate).

Preferably, the insulating material comprises an oxide of one or more of aluminium, zirconium, silicon, yttrium and ytterbium. More preferably, the insulating material comprises an oxide of one or more of aluminium and silicon, for instance $Al_2O_3$.

The layer of an insulating material typically has a thickness of from 20 nm to 1000 nm, for instance from 50 nm to 500 nm or from 100 nm to 300 nm.

An advantage of the use of a back electrode architecture is that one side of the photoactive material is completely exposed to incident light. A coating may be applied to this side to reduce reflection of light and improve absorption. Thus, the optoelectronic device may further comprise an anti-reflective coating disposed on the photoactive material. The anti-reflective coating may comprise a roughened or textured surface. The anti-reflective coating may comprise a material having a different refractive index to the crystalline material.

The optoelectronic device may further comprise a passivation layer disposed on the layer of the photoactive material. The passivation layer typically comprises a passivating agent which is an organic compound. The passivating agent is typically a trialkylphosphine oxide, for instance trioctylphosphine oxide. The passivating agent may be an organic compound as described in WO 2015/092397, the entirety of which is incorporated herein by reference, for instance iodopentafluorobenzene or thiophene. Typically, if present, the thickness of the passivation layer is from 0.5 nm to 10 nm.

The optoelectronic device may further comprise a hydrophobic layer disposed on the layer of the photoactive material. The hydrophobic layer typically comprises a hydrophobic compound or a hydrophobic polymer. The hydrophobic compound or hydrophobic polymer is typically a non-polar compound or a non-polar polymer. Examples of hydrophobic compounds include hydrocarbon compounds, organic compounds and silica. Examples of hydrophobic polymers include polyalkenes, polyacrylates, polyesters and polycarbonates.

The optoelectronic device typically further comprises a layer of a base material, and wherein the layer of the first electrode material is disposed on the layer of the base material. This layer of a base material can provide mechanical strength to the optoelectronic device. The base material typically comprises glass, plastic, metal, and/or silicon. Often, the layer of the base material is a layer of glass or a layer of plastic. The layer of the base material may be a flexible material, for instance a flexible layer of plastic or a metal selected from steel, copper, tungsten and molybdenum. The layer of a base material typically has a thickness of from 1.0 to 2.0 cm. The substrate may for instance be a rigid metal sheet.

The optoelectronic device is typically a back-contact device. The optoelectronic device therefore typically comprises a layer of the photoactive material having a first side and a second side, and wherein the first side of the layer of the photoactive material is in contact with the substrate. Thus, the optoelectronic device is typically a back-contact optoelectronic device and light is absorbed or emitted through the second side of the layer of the photoactive material. Typically the second side is on the opposite side of the device to the first side.

The structure of the substrate and electrodes is such that the first and second electrodes are on the same side of the substrate. Thus, the substrate typically has a first side on which the one or more first and second electrodes are disposed, and wherein the photoactive material is disposed on the first side of the substrate.

The layer of the first electrode material typically has a thickness of from 10 nm to 1000 nm. For instance, the first electrode material may have a thickness of from 10 nm to 300 nm. Often, the first electrode material has a thickness of from 50 nm to 200 nm.

Figure 10:
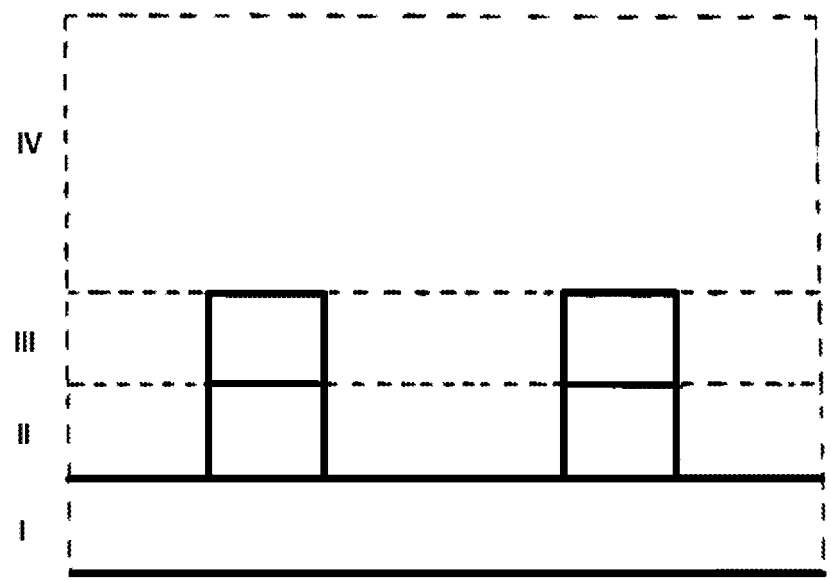
FIG. 10 shows a schematic side view of an embodiment of the optoelectronic device.

The optoelectronic device typically comprises a second layer disposed on the layer of the first electrode material, which second layer comprises the layer of the insulating material and the photoactive material. The optoelectronic device typically comprises a third layer disposed on the second layer, which third layer comprises the second electrode material and the photoactive material. The optoelectronic device typically comprises a fourth layer disposed on the third layer, which fourth layer comprises the photoactive material. Thus, when viewed from the side, the optoelectronic device may comprise four layers: a layer comprising the first electrode material; a second layer comprising regions of the insulating material and, disposed between those regions and in contact with the first electrode material, regions of the photoactive material; a third layer comprising regions of the second electrode material and, disposed between the regions of the second electrode material, regions of the photoactive material; and a fourth layer which comprises only the photoactive material (i.e. the bulk absorber/emitter region of the optoelectronic device. This is shown schematically in FIG. 10 for an embodiment of the invention with the layers labelled as I, II, III and IV respectively. The fourth layer is often without open porosity.

The second layer typically has a thickness of from 50 nm to 2000 nm, for instance from 100 nm to 400 nm. The third layer typically has a thickness of from 50 nm to 1000 nm, for instance from 100 nm to 500 nm. The fourth layer typically has a thickness of from 5 nm to 5000 nm, for instance from 500 nm to 4000 nm or from 1000 nm to 3000 nm.

The layer of the insulating material is typically a patterned layer of the insulating material. Thus, disposed on the layer of a first electrode material, there may be a patterned layer of the insulating material, for instance a patterned layer comprising a plurality of strips of the insulating material. "Patterned" in this context may mean disposed in a pre-determined form. The patterned layer of the insulating material may form one or more comb-like regions of the insulating material. The second electrode material is typically disposed on the patterned layer of the insulating material and forms at least part of the at least one second electrode, which second electrode is patterned. Thus, the second electrode may be a patterned electrode while the first electrode is typically a layer of the first electrode material which is not patterned.

The layer of the insulating material typically comprises two or more linear regions of the insulating material. A linear region of a layer of material is a region of material which is elongate, and may for instance take the form of a substantially rectangular region, a strip or a wire. Thus, the layer of the insulating material typically comprises (or be in part formed from) two or more strips of the insulating material.

Figure 8:
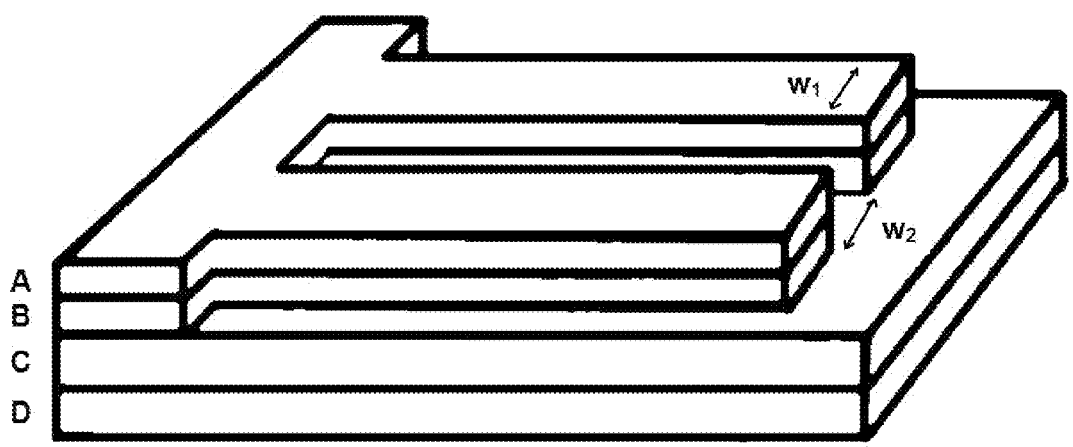
FIG. 8 shows a schematic perspective diagram of an electrode substrate useful in the invention. A is the layer of the second electrode material, B is the layer of an insulating material, C is the layer of the first electrode material, and D is a layer of a base material.

The substrate typically comprises two or more linear regions of the insulating material disposed on the layer of the first electrode material, and, disposed on each linear region of the insulating material, a linear region of the second electrode material. Thus, the substrate may comprise two or more strips of the insulating material with a further strip of the second electrode material disposed on each strip of the insulating material. The schematic in FIG. 8 shows an embodiment wherein the substrate comprises two linear regions (e.g. strips) of the second electrode material (A) disposed on two linear regions (e.g. strips) of the insulating material (B), all of which is disposed on the layer of the first electrode material Typically, one or more of the linear regions of the insulating material and/or the linear regions of the second electrode material has a width of from 100 nm to 50 µm and a length of from 10 µm to 1.0 m. Thus, the linear regions of the insulating material (second electrode material) may be strips of the insulating material (second electrode material) having a width of from 100 nm to 50 µm and a length of from 10 µm to 1.0 m (i.e. 1000 mm). The width of the linear regions is preferably from 300 nm to 5 µm, for instance from 1.0 µm to 5 µm. The width of the linear regions in the embodiment of FIG. 9 is shown by $w_i$. The length of the one or more linear regions is preferably from 1.0 mm to 500 mm.

The substrate comprises two or more exposed linear regions of the first electrode material. An "exposed region of the first electrode material" is a region of the first electrode material which is not (substantially) covered by the layer of the insulating material. An exposed region of the first electrode material is therefore typically a region of the first electrode material which is in contact with the photoactive material. The exposed linear regions may be exposed strips of the first electrode material. The one or more of the exposed linear regions of the first electrode material typically has a width of from 10 nm to 50 µm and a length of from 10 µm to 1.0 m. The width of the exposed linear regions is preferably from 100 nm to 4.0 µm, for instance from 0.2 µm to 5.0 µm. The width of the exposed linear regions in the embodiment of FIG. 9 is shown by $w_2$. The length of the one or more exposed linear regions is preferably from 1.0 mm to 500 mm.

In some embodiments, the substrate comprises three or more linear region of the second electrode material which are substantially parallel and wherein the separation between two adjacent linear regions of the second electrode material is from 100 nm to 50 µm, preferably wherein the separation between two adjacent linear regions of the second electrode material is from 200 nm to 2.0 µm. Substantially parallel linear regions may for instance have edges which are at an angle of from +5.0° to −5.0° relative to each other.

In some embodiments, the substrate comprises three or more linear region of the second electrode material which are substantially parallel and wherein the separation between two adjacent linear regions of the second electrode material is from 50 µm to 1.0 mm.

The substrate may for instance comprise a plurality of linear regions of the second electrode material connected to a further region of the second electrode material so as to form at least part of the at least one second electrode. Such a structure may be referred to a as a comb-like structure. For instance, the at least one second electrode may comprise a comb-like structure of the second electrode material disposed on a comb-like structure of the insulating material.

Alternatively, the patterned layer of the insulating material may comprise a plurality of regions which do not comprise the insulating material. The plurality of regions may be a plurality of substantially circular regions. This is shown schematically in FIG. 9 and FIG. 27. The plurality of substantially circular region may be arranged in a hexagonal form, for instance a honeycomb pattern. For instance, the patterned layer of the insulating material may comprise a plurality of holes. The second electrode material is typically disposed on the patterned layer of the insulating material and forms at least part of the at least one second electrode, which second electrode is patterned. Thus the second electrode may comprise a plurality of holes through which the first electrode is exposed to the photoactive material. The layer of the second electrode material and the layer of the insulating material may be obtainable from a process comprising a step of (i) disposing a plurality of substantially spherical particles on the layer of the first electrode material and (ii) performing a lithography step to define a second electrode pattern on the layer of the first electrode material. This process may be described further below.

The insulating material separates the first and second electrodes. The photoactive material is typically in contact with the insulating material. The first electrode is usually not in contact with the second electrode. Thus, the first electrode is usually not in electrical contact with the second electrode.

The optoelectronic device may be a photovoltaic device, photodiode, solar cell, phototransistor, photomultiplier, photodetector, photoresistor, light emitting device, light emitting diode, laser or charge injection laser. The optoelectronic device is typically a light emitting device or a photovoltaic device. Preferably, the optoelectronic device is a photovoltaic device.

The optoelectronic device may be a tandem optoelectronic device and further comprise, disposed on the photoactive material, a tandem region comprising a first tandem electrode, a second tandem electrode and a layer of a tandem photoactive material.

Substrate

The invention also provides a substrate comprising at least one first electrode, which at least one first electrode comprises a first electrode material, and at least one second electrode, which at least one second electrode comprises a second electrode material;
wherein the substrate comprises:
a layer of the first electrode material; and,
disposed on the layer of the first electrode material, a layer of an insulating material, which layer of an insulating material partially covers the layer of the first electrode material; and,
disposed on the layer of the insulating material, the second electrode material;
and wherein the first electrode material comprises a transparent conducting oxide and/or an oxide of titanium, tin, zinc, niobium, tantalum, indium, gallium, neodymium, palladium or cadmium and the second electrode material comprises a metal.

The substrate of the invention may be as further defined above for the optoelectronic device of the invention.

Process

Also provided by the invention is a process for producing a substrate comprising a first electrode and a second electrode, which process comprises:
(i) providing a layer of a first electrode material disposed on a layer of a base material;
(ii) disposing on the layer of the first electrode material a layer of a resist;
(iii) performing a lithography step to define a second electrode pattern on the layer of the first electrode material;
(iv) disposing, on the layer of resist, a layer of an insulating material;
(v) disposing, on the layer of the insulating material, a layer of a second electrode material; and
(vi) removing the resist and the material disposed on the resist.

Producing the layer of a first electrode material disposed on a layer of a base material typically comprises: providing a layer of a base material with a layer of a metal or a transparent conducting oxide disposed thereon; and disposing on the layer of the metal or the transparent conducting oxide a layer of an n-type or p-type semiconductor. Disposing the layer of an n-type or p-type semiconductor on the layer of the metal or the transparent conducting oxide typically comprises disposing on the layer of the metal or the transparent conducting oxide a composition comprising the n-type or p-type semiconductor or a precursor compound for the n-type or p-type semiconductor. The composition typically further comprises a solvent. For example, a composition comprising titanium isopropoxide and ethanol may be spin-coated onto the layer of the metal or the transparent conducting oxide and subsequently heated to form a layer of titanium dioxide. Alternatively, a composition comprising titanium diisopropoxide bis(acetylacetonate) and ethanol may be spray-coated onto the layer of the metal or the transparent conducting oxide and subsequently heated to form a layer of titanium dioxide. A layer of the n-type semiconductor tin dioxide may be produced by disposing on the layer of the metal or the transparent conducting oxide a composition comprising a solvent and a plurality of nanoparticles comprising tin dioxide and subsequently removing the solvent.

The lithography step typically comprises an e-beam lithography step, an optical lithography step or a nanocontact printing step. The lithography step may comprise exposing the layer of the resist to an electron beam or light to define a second electrode pattern in the resist. The pattern defined in the resist is typically a pattern defined by removal of the resist by the lithography step. The lithography step may comprise interference laser lithography or colloidal lithography.

The resist typically comprises a polymer, for instance polymethylmethacrylate (PMMA). The resist may be a bi-layer resist. For instance, the layer of resist may be a bi-layer of resist comprising a layer of a first PMMA and a layer of a second PMMA. The resist may alternatively comprise a plurality of substantially spherical particles. For instance, the resist may comprise a plurality of substantially spherical particles comprising a polymer such as polystyrene, polyethylene or PMMA. The plurality of substantially spherical particles may have a mean particle size (e.g. Dv50) of from 100 nm to 3000 nm, for instance from 500 to 1500 nm.

The resist is typically removed by exposing the resist to a solvent. The solvent may be any suitable solvent. For instance the solvent may comprise a ketone and/or an alcohol. Preferably, the solvent comprises a mixture of isopropanol (IPA) and methyl-isobutyl ketone (MIBK). Removal of the resist will typically remove any further layers disposed on the resist and will leave exposed regions of the first electrode material.

The process may further comprise, between steps (iv) and (v), a step of disposing a layer of an adhesion material on the layer of the insulating material. The adhesion material may for instance comprise chromium. The adhesion material may assist adhesion between the layer of the insulating material and the layer of the second electrode material.

The substrate, the layer of the base material, the layer of a first electrode material, the layer of an insulating material and/or the second electrode material may be as further defined for the optoelectronic device of the invention. Thus, the layer of the first electrode material may comprise a layer of transparent conducting oxide and an n-type semiconductor.

A process according to the invention may comprise: (i) providing a base material with a layer of a transparent conducting electrode (TCO) disposed thereon; (ii) disposing a compact layer of an n-type semiconductor (for instance titanium dioxide) on the layer of the TCO thereby forming a layer of a first electrode material disposed on a layer of a base material; (iii) disposing a layer of a resist on the layer of the first electrode material; (iv) performing a lithography step to define a second electrode pattern on the layer of the first electrode material; (v) disposing, on the layer of resist, a layer of an insulating material (for instance $Al_2O_3$); (vi) disposing, on the layer of the insulating material, a layer of a second electrode material (for instance gold); and (vii) removing the resist by applying a solvent to the substrate.

Step (v) may comprise: (v-a) disposing, on the layer of the insulating material, a layer of a metal, for instance nickel; or (v-b) disposing, on the layer of the insulating material, a layer of a metal, for instance gold, and disposing, on the layer of the metal, a layer of a p-type semiconductor, for instance nickel oxide.

If the process comprises step (v-a), the process typically further comprises a step (vii-a) wherein the substrate is annealed in order to form a layer of metal oxide on the layer of the metal. Step (vii-a) typically occurs after step (vi), removal of the resist. Annealing the substrate may comprise heating the substrate at a temperature of from 200° C. to 500° C. for a time of from 10 minutes to 100 minutes. For instance, the process of the invention may comprise: (v) disposing, on the layer of the insulating material, a layer of nickel or titanium; (vi) removing the resist and the material disposed on the resist to leave a patterned layer of nickel or titanium; and (vii) annealing the substrate to form a layer of nickel oxide on the layer of nickel or to form a layer of titanium dioxide on the layer of titanium.

If the process comprises step (v-b), the process typically further comprises a step (vii-b) wherein the substrate is treated with a compound suitable for forming a self-assembled monolayer on exposed surfaces of the layer of the metal. Step (vii-b) typically occurs after step (vi), removal of the resist. The compound suitable for forming a self-assembled monolayer typically comprises a thiol group or a thiophene group. For instance, the compound suitable for forming a self-assembled monolayer may be a alkane-1-thiol, for instance a $C_{6-14}$-alkane-1-thiol such as dodecane-1-thiol. The compound suitable for forming a self-assembled monolayer may act as a blocking layer.

The invention also provides a substrate obtainable by a process for producing a substrate comprising a first electrode and a second electrode as defined.

The invention also provides a process for producing an optoelectronic device comprising a substrate comprising a first electrode and a second electrode, which process comprises a step of producing the substrate by a process as defined herein. The process typically further comprises disposing a layer of a photoactive material on the substrate.

Prior to disposal of a layer of a photoactive material on the substrate, the substrate may be treated with an ionic liquid. For instance, the substrate may be treated with 1-butyl-3-methylimidazolium tetrafluoroborate. Treating the substrate with an ionic liquid may comprise disposing a composition comprising a solvent and the ionic liquid on the substrate and drying the substrate. The composition may for instance comprise an alcohol (for instance methanol or ethanol) and the ionic liquid at a concentration of from 0.001 to 1.0 wt %.

After disposing the layer of the photoactive material on the substrate, a passivation layer may be disposed the layer of the photoactive material. The passivation layer typically comprises a passivating agent which is an organic compound. The passivating agent is typically a trialkylphosphine oxide, for instance trioctylphosphine oxide. The passivating agent may be an organic compound as described in WO 2015/092397, the entirety of which is incorporated herein by reference, for instance iodopentafluorobenzene or thiophene. Disposing the passivating agent on the layer of the photoactive material typically comprises disposing a composition comprising a solvent (for instance chlorobenzene) and the passivating agent (for instance trioctylphosphine oxide).

The invention also provides an optoelectronic device obtainable by a process for producing an optoelectronic device as defined herein.

Module

The invention also provides a module comprising two or more of the optoelectronic devices according to the invention. The module may alternatively comprise two or more of the substrates according to the invention.

Figure 11:
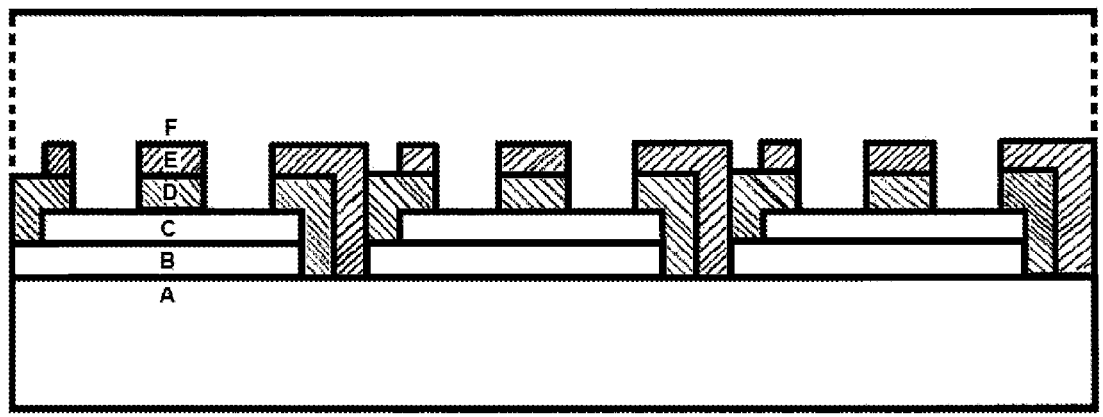
FIG. 11 shows a schematic side view of a module according to the invention comprising an interconnection between two adjacent cells. A is the base material, B and C together form the first electrode material (with C as an n-type semiconductor), D is an insulating material, E is the second electrode material and F is the crystalline compound.
Figure 12:
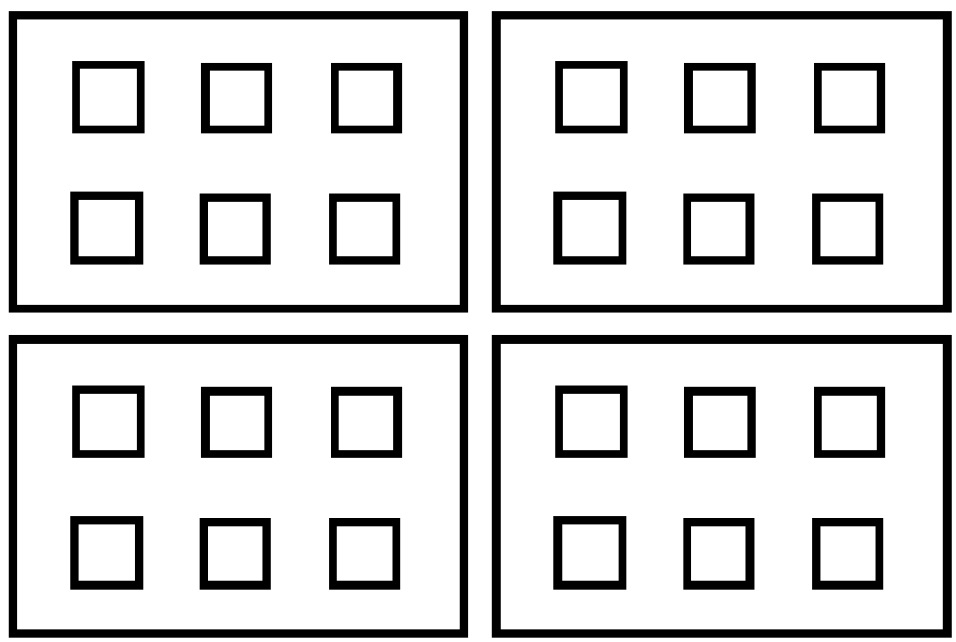
FIG. 12 shows a schematic plan view of a module according to the invention.

In the module according to the invention, each device or substrate may be interconnected. Typically, the devices or substrates are interconnected such that the first electrode of one device or substrate is electrically connected with the second electrode of an adjacent device or substrate. A schematic side view of a module according to the invention is shown in FIG. 11. A module according to the invention may comprise from 2 to 1000 devices or substrates according to the invention, for instance from 4 to 100 devices or substrates according to the invention. In a module of the invention, the area of each device or substrate as defined by the area of the second electrode of that device or module when viewed in plan my be from 0.1 $cm^2$ to 100 $cm^2$, for instance from 0.5 $cm^2$ to 10 $cm^2$. The distance between two adjacent devices or substrates according to the invention may be less than or equal to 1.0 mm, for instance less than or equal to 100 μm.

EXAMPLES

Example 1—Preparation of a Back Contact Photovoltaic Cell

Back contact photovoltaic cells containing methyl ammonium lead triiodide were prepared by the method below.
Substrate Preparation:

In short, fluorine-doped tin oxide (FTO) coated glass substrates were cleaned sequentially in Hellmanex, acetone, isopropanol and oxygen plasma. A compact layer of $TiO_2$ (50 nm) was deposited by spin coating (2000 rpm, 2000 rpm $s^{-1}$ ramp) a solution of titanium isopropoxide in ethanol (containing 35 ml of 2 M HCL per 5 ml of solution), and sintered at 500° C. for 30 min. The FTO and $TiO_2$ together form the first electrode material. The glass corresponds to the base material.
Patterning:

Electron beam lithography was carried out using a bi-layer PMMA resist. An initial layer of A8 PMMA 495K was spin coated on the glass-FTO-$TiO_2$ substrate at 1000 rpm for 60 seconds and baked on a hot plate at 180 C for 90 seconds. A second layer of A8 PMMA 950K was spun at 4000 rpm for 60 seconds and baked at 180° C. for 90 seconds. The top electrode pattern was exposed in an JEOL 5500FS e-beam lithography system. The exposed patterns were then developed in MIBK:IPA (methylisobutylketone:isopropanol) (1:3) for 90 seconds to achieve an undercut profile in the bilayer resist to aid lift-off. These steps could also be performed by the more simple nanocontact imprinting method with an appropriate stamp. After development, a 200 nm thick layer of $Al_2O_3$ was deposited by electron beam evaporation, followed by a thin (few nm) adhesion layer of Cr and 100 nm of Au. The samples were left in Acetone to lift-off the remaining resist leaving the top electrode pattern.

Perovskite Deposition

The $CH_3NH_3PbI_3$ perovskite was deposited via single step spin coating (2000 rpm) of lead acetate and methylammonium iodide precursors in a 1:3 molar ratio at 40 weight % lead content. The film was annealed at 100° C. for 10 minutes in a nitrogen glovebox, cooled to room temperature, and then encapsulated by spin coating a 40 mg/ml solution of poly-methylmethacrylate in toluene (at 200 rpm).

Device Characterization

For measuring the device performance parameters, Solar-simulated AM 1.5 sunlight was generated with an ABET solar simulator calibrated to give 100 mW cm$^{-2}$ using an NREL-calibrated KG5 filtered silicon reference cell, and the JV curves were recorded with a sourcemeter (Keithley 2400, USA).

Results and Discussion

Figure 2:
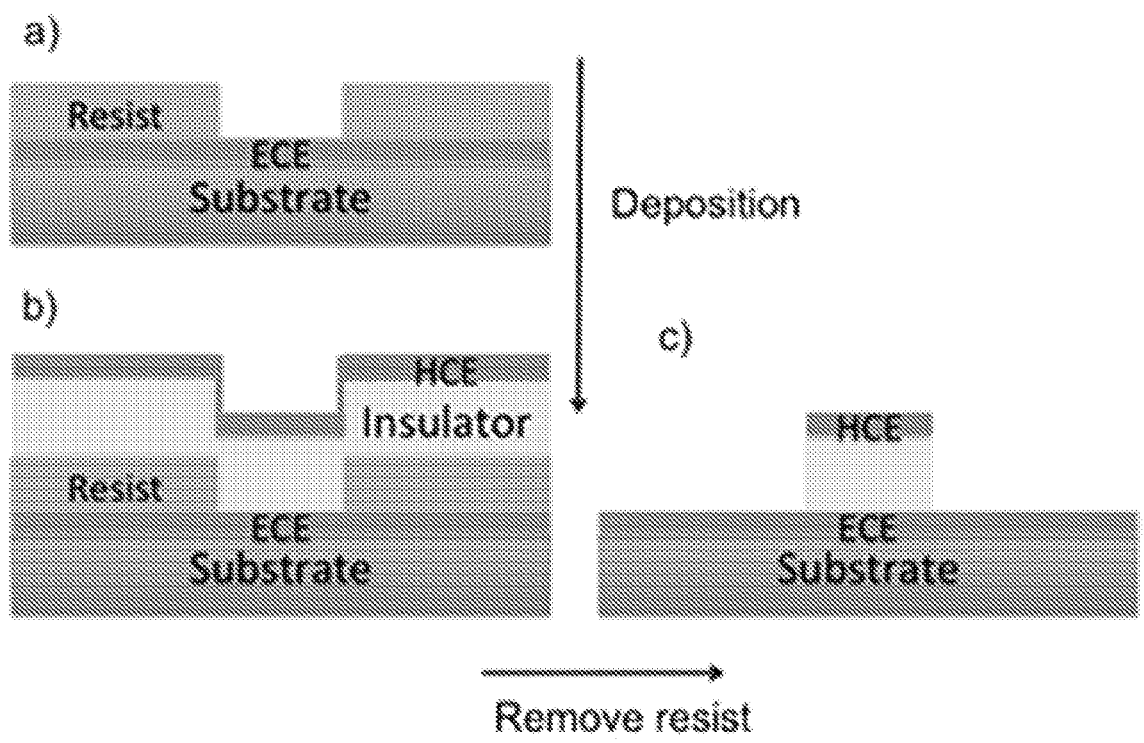
FIG. 2 shows a schematic of the process of the invention for producing a substrate electrode.
Figure 3:
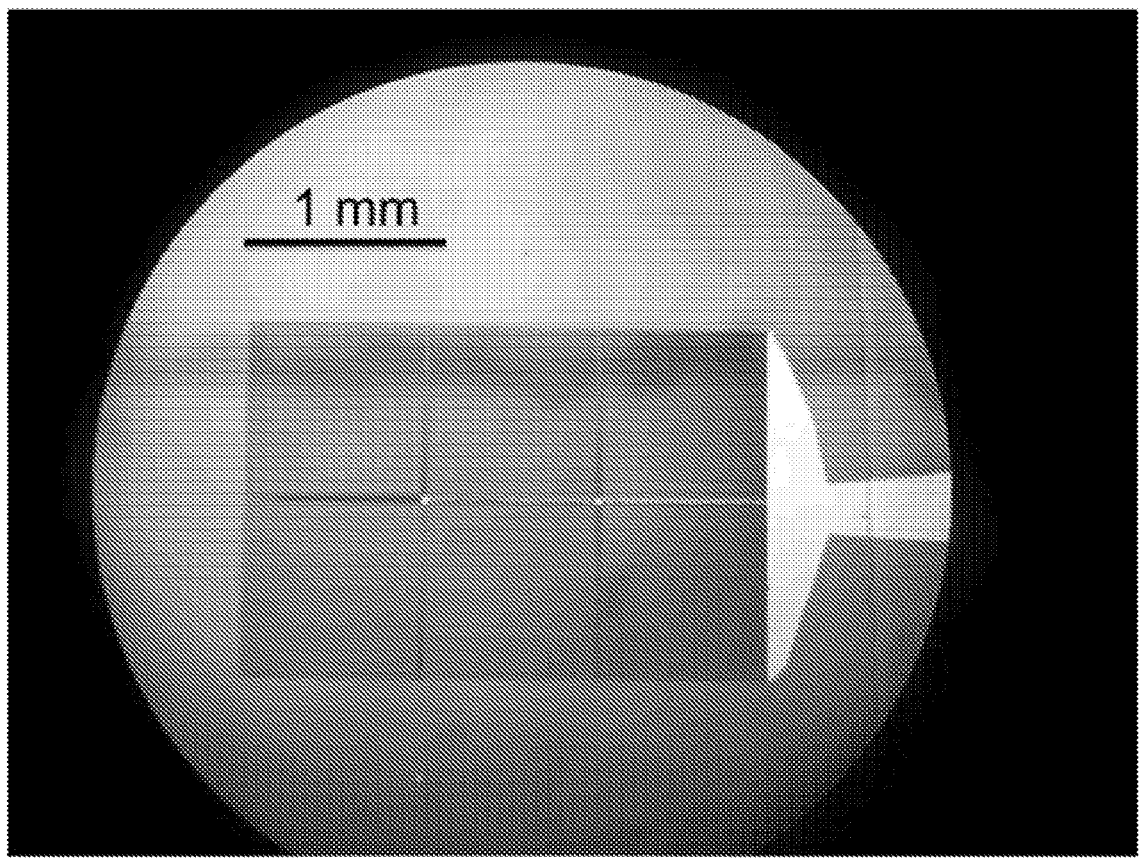
FIG. 3 shows a microscope image of a macroscopic electrode of many individual thin electrodes all connected to form one large electrode. The thicker cross-like features are thicker strips of the HCE electrode to avoid losses in the case of small breaks along the thin electrodes.
Figure 4:
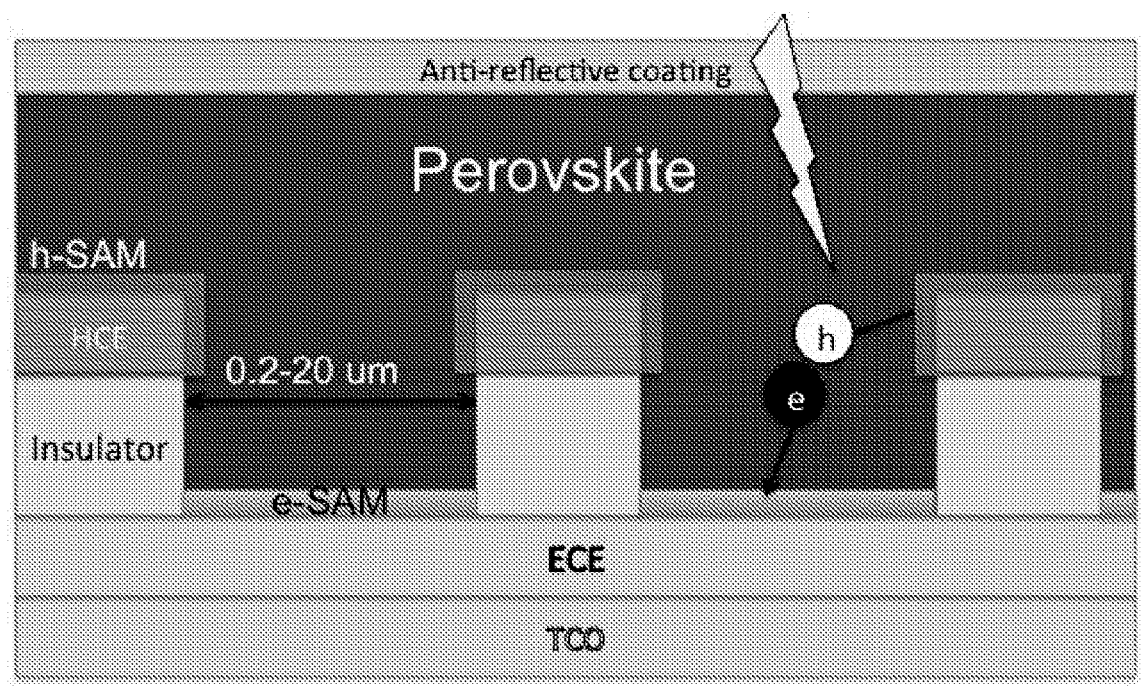
FIG. 4 shows a schematic of the final generalized device structure.

The process of the invention for producing the novel device architecture is shown schematically in FIG. 2. Schematics of possible electrode structures are shown in FIGS. 4 and 8. In the present Example, the substrate is a piece of glass coated with a transparent conducting oxide (TCO). This is then uniformly coated with an electron selective material (i.e. the n-type semiconductor $TiO_2$) to form an electron collecting electrode (ECE). A patterned resist is then coated upon this electron selective contact via nano-lithography or nano-contact imprinting (FIG. 2 (a)). This is followed by deposition of first an insulator such as $Al_2O_3$, and then a metal or hole collecting electrode (HCE) such as gold (FIG. 2 (b)). The resist is removed, leaving behind just the patterned electrode design (FIG. 2 (c)). The resulting electrode oeithmany individual thin all connected to form one large electrode is shown on a larger scale in the microscope image in FIG. 3. The thicker cross-like features are thicker strips of the HCE electrode to avoid losses in the case of small breaks along the thin electrodes. In this manner, it is possible to prevent contact between the ECE and the hole collecting HCE even though they are both placed on the same bottom substrate. The solution processed perovskite semiconductor can then be deposited uniformly on top of the substrate.

In the schematic of FIG. 4, the ECE and HCE are electronically insulated from each other by the $Al_2O_3$ barrier. This is all possible through just a single lithographic step. The ECE and HCE can also be coated with self-assembling monolayers (e-SAMs and h-SAMs, respectively) to make the ECE and HCE more electron and hole selective, respectively. An anti-reflective layer can also be deposited on top of the semiconductor to enhance the light harvesting of the final solar cell. The many parallel HCEs are connected at the end of the electrode, so that they function as one electrode, as demonstrated in the microscope image in FIG. 3. An example of this is shown in FIG. 4, where the total electrode architecture is shown. The first two layers could also be readily and cheaply prepared, for example, by sintering a piece of titanium foil in an oxygen atmosphere to yield a conductive titanium foil coated with an electron selective $TiO_2$ compact layer. This latter option would however not be suitable for solar cell applications where the solar cell needs to be semi transparent, such as is the case in window applications.

Figure 5:
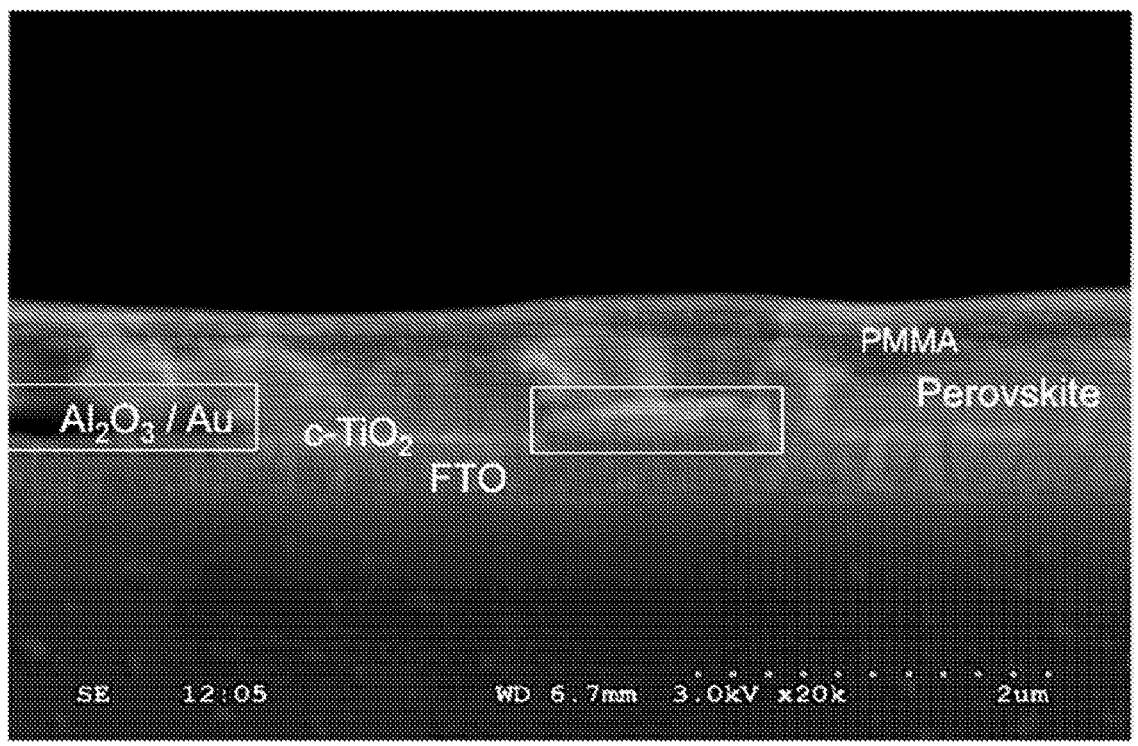
FIG. 5 shows a scanning electron microscope image a cross-section of one of the devices prepared in the preliminary study.

In the proof-of-principle device demonstrated here, glass was used as the substrate, FTO with a 50 nm thick layer of compact $TiO_2$ was used as the ECE, $Al_2O_3$ was used as the insulating material, gold was used as the HCE, and $CH_3NH_3PbI_3$ (made from methylammonium iodide and lead acetate precursors) as the semiconductor. The inert polymer polymethylmethacrilate (PMMA) was used to protect the perovskite layer from contact with air. The scanning electron microscope image in FIG. 5 shows a cross-section of one of the devices prepared in this Example.

Figure 6:
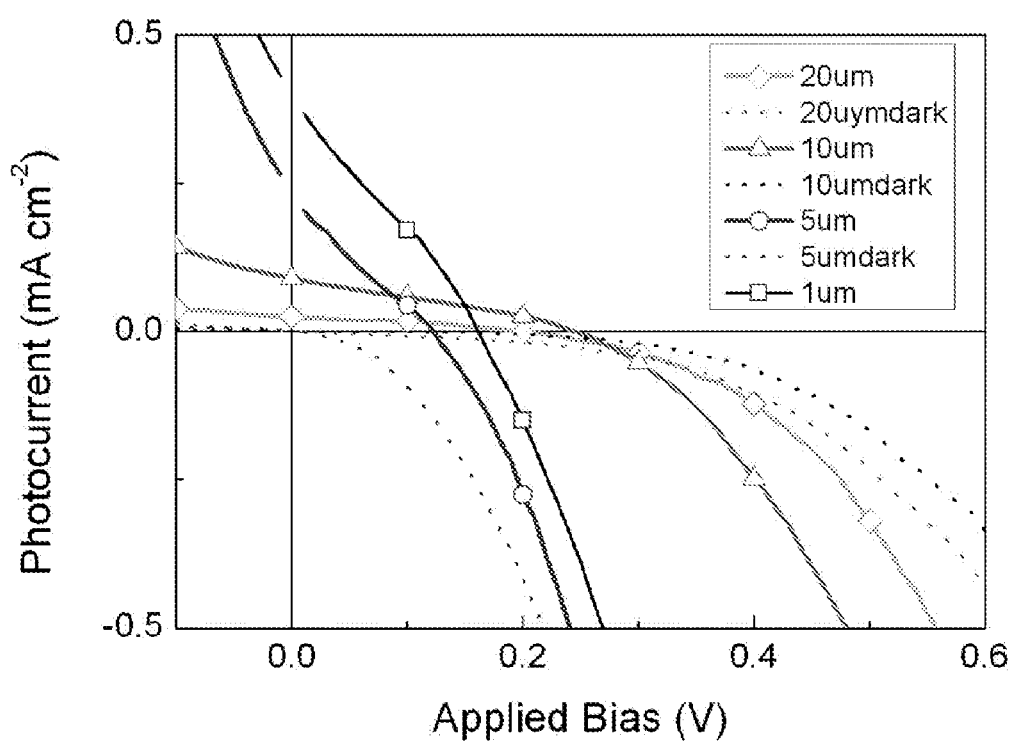
FIG. 6 shows current density-voltage (JV) characteristics of the devices with (1, 5, 10, 15 µm) different hole conducting electrode spacing.
Figure 7:
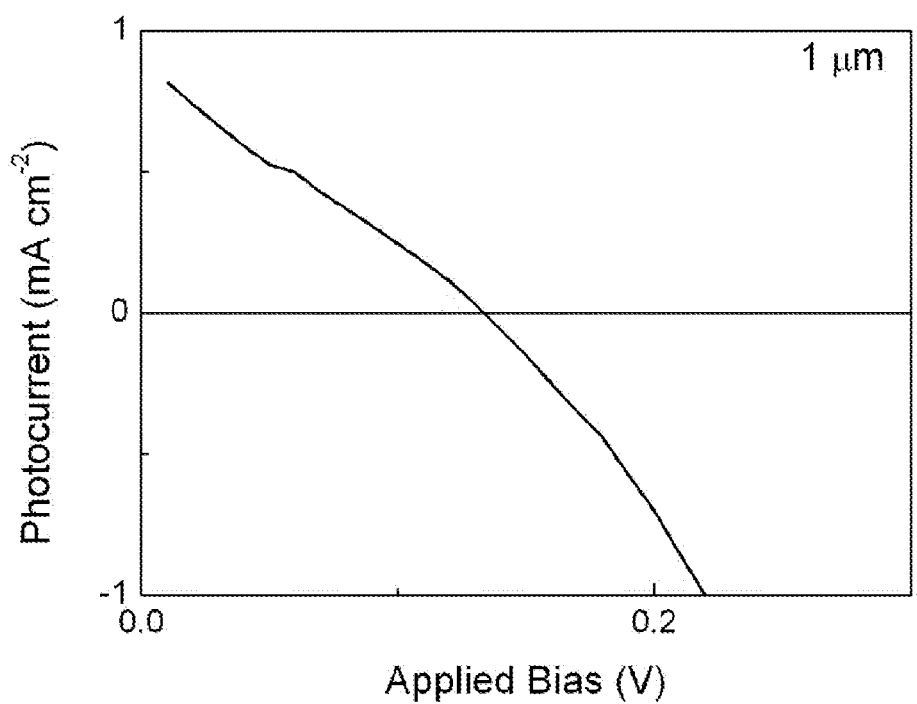
FIG. 7 shows the JV characteristics of a device with 1 µm hole conducting electrode spacing with the highest photocurrent at short circuit of around 1 mA cm$^{-2}$.

The current-density-voltage (JV) curves for the solar cells produced are shown in FIG. 6. Here, the spacing between gold stripe electrodes was 1, 5, 10 or 20 µm.

In this preliminary study, it is apparent that the performance of the devices is not that high and that it increases with decreased electrode spacing. It is hypothesized that this is for two reasons. First, the diffusion length of the charges in the material should be approximately 2 µm, as demonstrated by previous measurements. However, since the electrons should be rapidly collected by the ECE layer and only holes are left in the perovskite, the hole lifetime should increase dramatically to also increase the effective hole diffusion length. It is more likely that the simple electrodes used in this initial test were simply not selective enough. As a result, poor electron extraction and high recombination rates at the gold electrode will be limiting these devices. It is likely that the use of selective SAMs such as $C_{60}$ and pyridines or thiols at the electron and hole selective contacts respectively, will dramatically enhance the performance even for the architectures with longer lateral spacing. The longer the lateral spacing, of course, the less metal is required, the more transparent the bottom electrode is, and the cheaper the device is to prepare.

Nonetheless, it is apparent that the devices function as photovoltaic devices. The dark J-V curves demonstrate rectifying behaviour, while photocurrents up to 1 mA cm$^{-2}$ and open circuit voltages around 0.3 V are obtained. This is proof that this architecture is capable of functioning as a solar cell. The performances may be enhanced over that of the conventional vertical device structure once the selectivity of the contacts is improved.

Example 2—Preparation of a Back Contact Photovoltaic Cell

Back contact photovoltaic cells comprising methylammonium lead chloride iodide were produced by the methods described below. The substrate was produced using different electrode materials and using different surface treatments.

Substrate Cleaning:

FTO coated glass substrates with 15 Ohm/sq sheet resistance were etched with Zinc powder and 2M HCl to create non-conductive edge stripes. The etched substrates were rinsed in DI water and cleaned rigorously by brushing Hellmanex solution with a toothbrush before rinsing again in a stream of DI water. Nitrogen was used to dry the substrates that were then subsequently rinsed in acetone and 2-propanol and then etched for 10 min in oxygen plasma.

Bottom N-type Layer Deposition:

Spin-Coated $TiO_2$:

The n-type $TiO_2$ compact layer was formed by spin-coating a solution of 0.71 g titanium isopropoxide and 0.07 g of 2M HCl in 8 mL of ethanol with 2000 rpm for 45 seconds onto the substrate and then annealing it at 500° C. for 45 minutes.

Spin-Coated $SnO_2$:

$SnO_2$ nanoparticles were synthesized via hydrothermal method. 467 mg of $SnCl_4 \cdot 5H_2O$ (98% Sigma-Aldrich) were dissolved in 20 ml of deionized (DI) water. After 10 minutes of stirring at room temperature, a fully dissolved, clear solution was obtained. This solution was then transferred to a Teflon-lined stainless steel autoclave, and heated for 2 hours at 200° C. After heating treatment, the autoclave was quenched to room temperature using cold water. The precipitates were centrifuged at 9000 rpm for 15 min. The nanoparticles were re-dispersed in ethanol in a sonication bath. This washing treatment was repeated 3 times. After the final washing treatment, the nanoparticles were re-dispersed in ethanol in a concentration of 5 mg/ml. The nanoparticle solution was spread on the sample in a volume of 100 µl and then spin-coated at 2000 rpm for 45 seconds. Right after the spin-coating the substrates were placed on a 150° C. heated hot plate to dry off the solvent for 10 minutes.

Spray-Coated TiO2:

The substrates were heated to 250° C. on a hotplate. Titanium diisopropoxide bis(acetylacetonate) was diluted in anhydrous Ethanol in a concentration of 1:10 (v:v). 15 ml of this solution was homogenously sprayed with a hand pump over the hot substrates with a total area of 11.4 cm×22.4 cm. The sprays were carried out by spraying for 10 seconds and then waiting for 20 seconds. The substrates were kept for another 10 minutes at 250° C. and then heated up to 500° C. for 45 minutes before cooling down.

Bottom P-Type Layer Deposition:

Inverted devices were produced by depositing a first electrode material comprising a layer of a p-type semiconductor as the lower electrode layer in the device.

1 mmol of nickel nitrate hexahydrate was fully dissolved in 1 mL of ethylene glycol and 1 mmol of ethylenediamine was added to the solution. The smoke was blown out with compressed air before capping. After shaking the solution vigorously, it was put into a syringe and filtered through a 0.2 µm filter directly onto the FTO substrate to avoid agglomeration. The substrate was spin-coated at 5000 rpm for 50 seconds and then dried at 100° C. on a hot plate for 10 minutes. The films were then annealed at 300° C. for 1 hour.

Rear Contact Fabrication:

The image reversal photoresist AZ 5214 E was spin-coated at 5000 rpm for 45 seconds and baked for 50 seconds at 110° C. UV-light exposure through a chrome patterned glass photomask and subsequent image reversal lead to the solubility of the regions designed for the fingers of the rear contacts. These were dissolved in a developer bath, resulting in a patterned photoresist layer.

Figure 13:
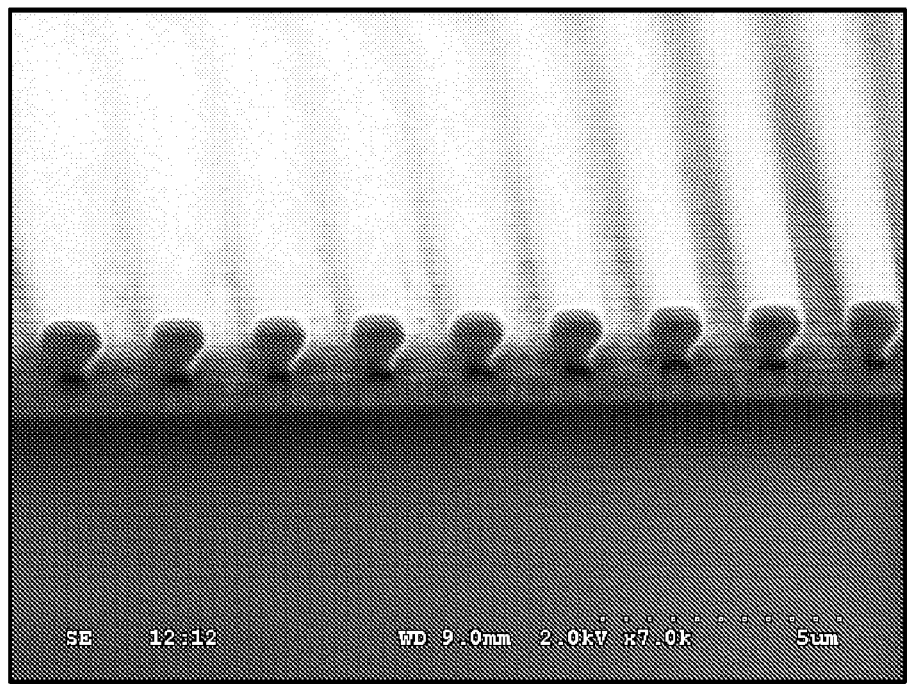
FIG. 13 shows a tilted SEM image of the patterned photoresist after development, showing a undercut profile beneficial for lift-off with pitch distance and finger width of 1 µm.
Figure 14:
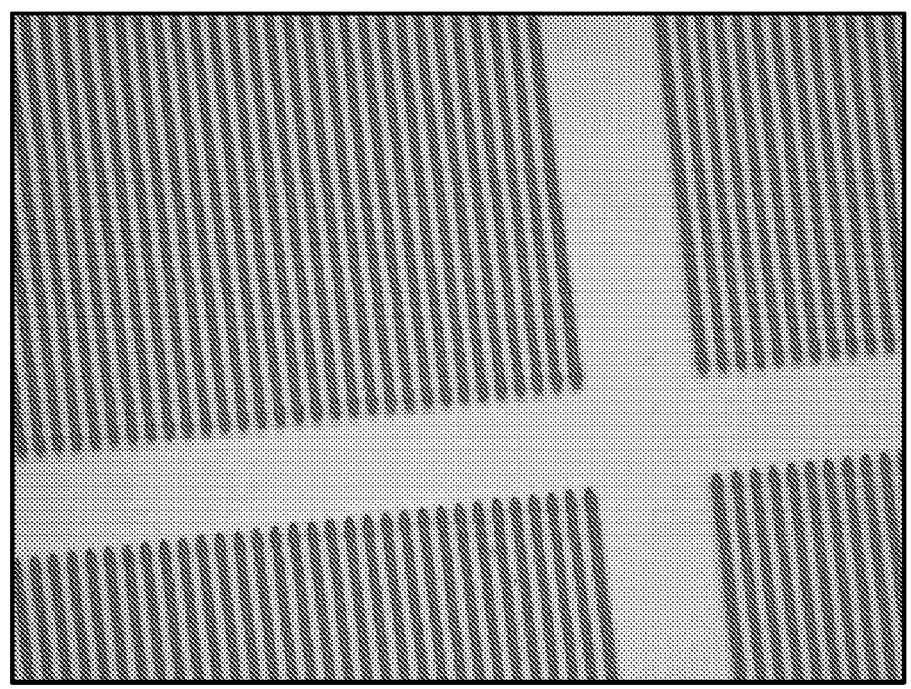
FIG. 14 shows an optical microscope image showing the patterned electrodes with pitch and finger width of 1 µm after lift-off.

A tilted SEM image of a patterned photoresist after development showing a beneficial undercut profile with pitch distance and finger width of 1 µm is shown in FIG. 13. FIG. 14 shows an optical microscope image showing patterned electrodes with pitch and finger width of 1 µm after lift-off.

Figure 22:
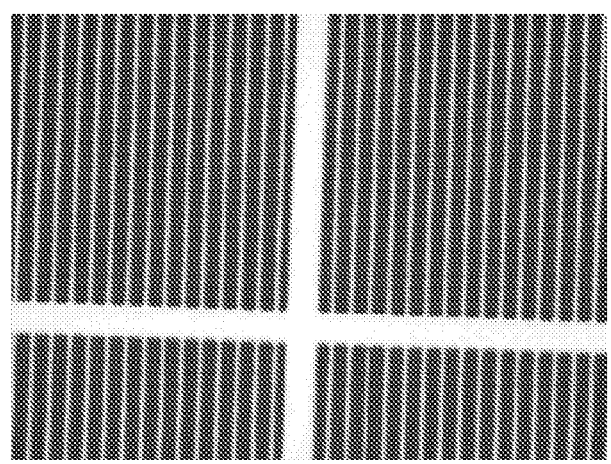
FIG. 22 shows optical microscope image of patterned electrodes after lift-off with finger width of 1 μm and pitch distance of 5 μm.
Figure 23:
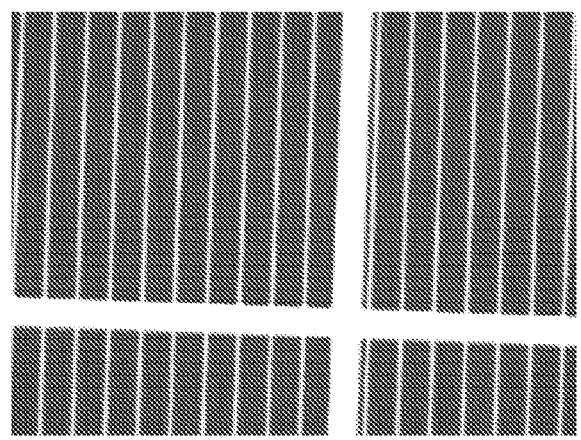
FIG. 23 shows optical microscope image of patterned electrodes after lift-off with finger width of lgm and pitch distance of 10 μm.
Figure 24:
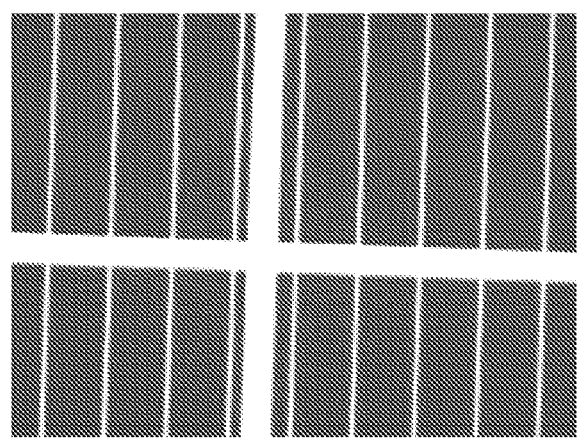
FIG. 24 shows optical microscope image of patterned electrodes after lift-off with finger width of 1 μm and pitch distance of 20 μm.

FIGS. 22 to 24 show optical microscope images of patterned electrodes after lift-off with finger width of 1 µm and pitch distances of from 5 to 20 µm (5, 10 or 20 µm).

Ni+NiO Shell Hole Conducting Electrode:

The patterned photoresist layer was coated with 100 nm of insulating $Al_2O_3$ and 100 nm of nickel through e-beam evaporation. The lift-off of the remaining photoresist regions was performed in a heated bath of dimethylsulfoxide. The Ni based devices were subsequently annealed at 400° C. for 30 minutes to create a shell of oxidized Ni as a p-type electron blocking layer.

Au+NiO+Thiol Blocking Layer for Hole Conducting Electrode:

The patterned photoresist layer was coated with 100 nm of insulating $Al_2O_3$ and 100 nm of Au+10 nm of NiO through e-beam evaporation. The lift-off of the remaining photoresist regions was performed in a heated bath of dimethylsulfoxide.

The alkanethiol blocking layer was assembled onto the exposed gold areas by dissolving 1 mM of dodecane-1-thiol in ethanol and immersing the prepared substrates with the patterned electrodes for 24 h for self assembly.

Figure 17:
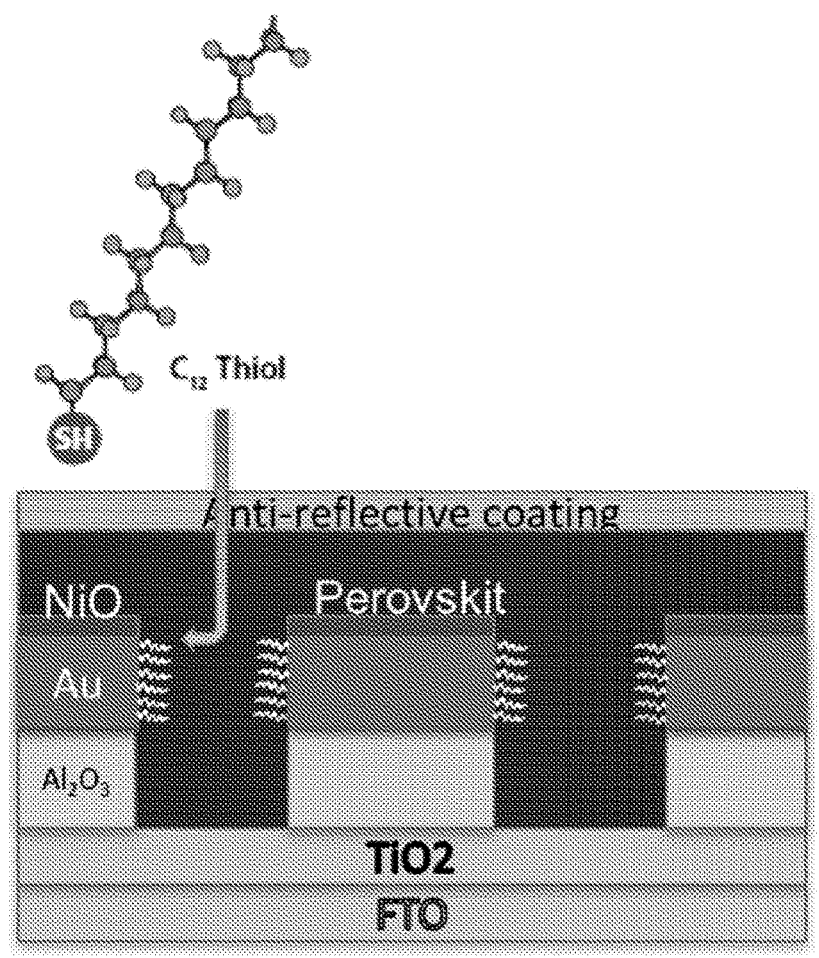
FIG. 17 shows a schematic of rear contact device in which hole conducting layer is evaporated onto gold electrode before lift-off. The shunt creating exposed sides of the gold electrode are treated by a self-assembling insulating layer of 1-dodecanethiol to prevent electron injection into the gold.

A schematic of the rear contact device in which hole conducting layer is evaporated onto gold electrode before lift-off is shown in FIG. 17. The shunt creating exposed sides of the gold electrode are treated by a self-assembling insulating layer of dodecane-1-thiol to prevent electron injection into the gold.

Al+Ti+$TiO_2$ Shell Electron Conducting Electrode for Inverted Device:

The following was carried out to complete the substrate structure in the inverted device containing a lower, first electrode layer of nickel and nickel oxide.

The patterned photoresist layer was coated with 100 nm of insulating $Al_2O_3$ and 50 nm of Al and 50 nm of titanium through e-beam evaporation. The lift-off of the remaining photoresist regions was performed in a heated bath of dimethylsulfoxide. The aluminium and titanium based devices were subsequently annealed at 400° C. for 30 minutes to create a shell of oxidized Al as blocking layer around the Al and a shell of $TiO_2$ as a n-type hole blocking layer.

Ionic Liquid Deposition:

0.01 wt % of 1-butyl-3-methylimidazolium tetrafluoroborate (ionic liquid, IL) was dissolved in methanol and the solution was spread onto the patterned electrodes after the lift-off and annealing process, then spin-coated at 4000 rpm for 20 seconds to be then dried at 80° C. for 10 minutes on a hotplate before perovskite deposition.

Perovskite Deposition:

A solution of 3:0.98:0.02 M methylammonium iodide (MAI):PbCl2:PbI2 was dissolved in a concentration of 38.5 wt % in dimethylformamide and spin-coated onto the electron patterned substrates at 2000 rpm for 45 sec in a dry air atmosphere. The drying of the deposited solution was performed under a weak air flow and then letting the substrates rest for 15 min at room temperature and additionally 15 min at 70° C. on a hotplate. The films were then annealed in an oven for 90 min at 100° C. and 15 min at 120° C. After letting the films cool down at room temperature, a layer of PMMA was finally deposited by spin-coating a solution of 15 mg of PMMA dissolved in 1mL of Chlorobenzene.

Figure 15:
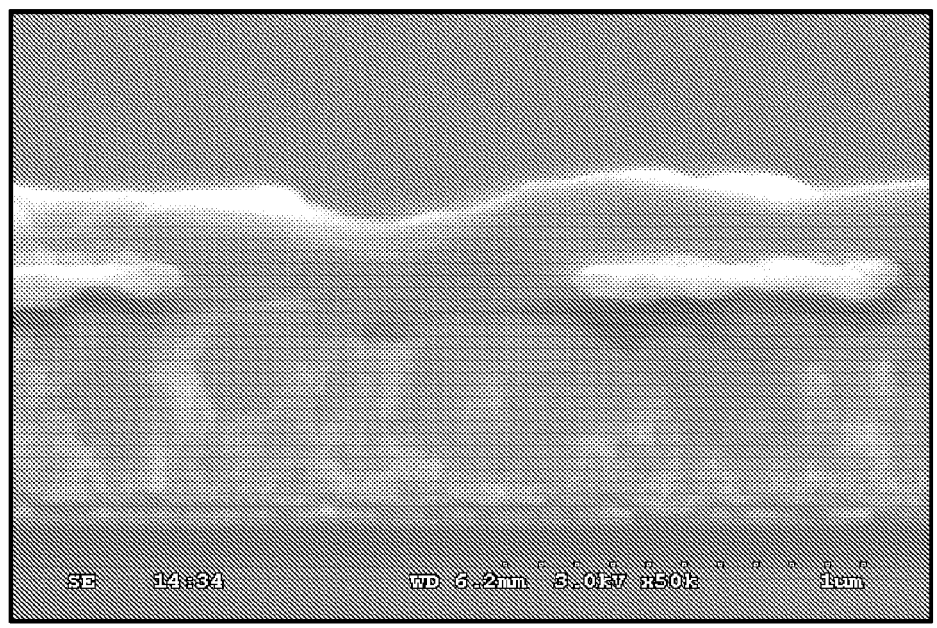
FIG. 15 shows a cross sectional SEM image showing Ni+NiO electrodes on top of insulating $Al_2O_3$ surrounded by perovskite covered with a thin layer of PMMA.

FIG. 15 shows a cross-sectional SEM image showing Ni+NiO electrodes on top of insulating $Al_2O_3$ surrounded by perovskite covered with a thin layer of PMMA.

Surface Passivation Layer:

Trioctylphosphine oxide with 99% purity was dissolved with a concentration of 0.025 M in anhydrous chlorobenzene. 100 µl of this solution was spread on the surface of the perovskite layer and then spin-coated for 60 sec at 2000 rpm.

Circular Shaped Back Electrodes

Figure 27:
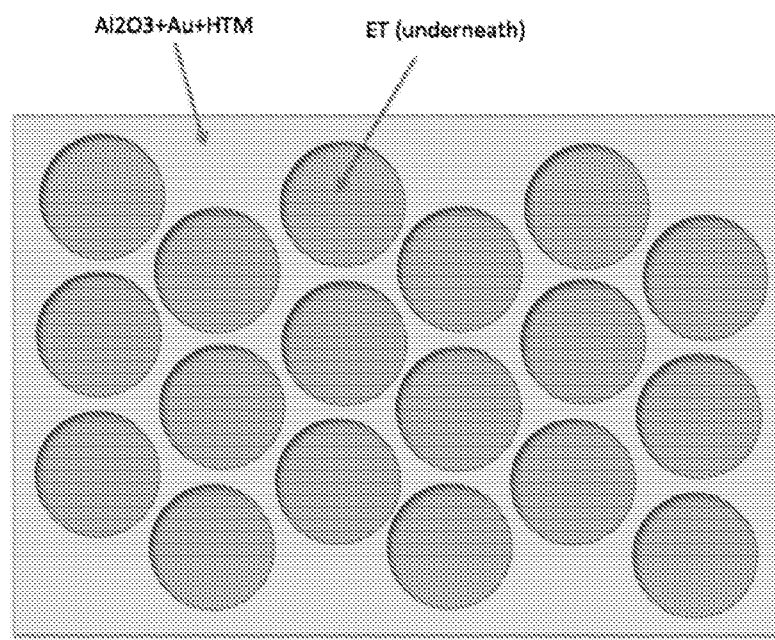
FIG. 27 shows a schematic of circular shaped back electrodes with electron transporting layer on the bottom and hole transporting electrode separated by insulator.

As an alternative to comb-shaped second electrodes, substrates were produced with circular shaped back electrodes as described below. A schematic of circular shaped back electrodes with electron transporting layer on the bottom and hole transporting electrode separated by insulator as shown in FIG. 27.

Deposition of Closely Packed Monolayer of Polystyrene Microspheres:

The diameters of employed microspheres were 1µm (Fischer-Scientific, 10 wt %). The particle solution was mixed in a 10:1 (v/v) dilution with a 1:400 (v/v) solution of Triton X-100 in methanol. The resulting solution was dispersed for 10 minutes in a sonication bath and then filtered with a 2.7 µm filter. The multi-step spin-coating involved a first step of 300 rpm for 10 seconds, a second step at 600 rpm for two minutes and an additional step of 2000 rpm for 10 seconds. The self-assembled polystyrene monolayer was dried at room temperature in air for about 3 hours.

Microsphere Lithography

Polyacrylic acid (PAA) was dissolved in anhydrous ethanol at a concentration of 4 mg/mL and subsequently spin coated onto an already spinning substrate with the closely packed monolayer at 2000 rpm for 60 sec. The substrate was then dried at 60° C. on a hotplate to remove the remaining solvent. 50 nm of Au was evaporated in a thermal evaporator to cover the insulating PAA regions as well as the microspheres. The substrate was immersed in a bath of toluene and sonicated for 10 minutes to lift-off the polystyrene microspheres and leave behind the porous layer of insulating PAA and conducting Au.

Figure 28:
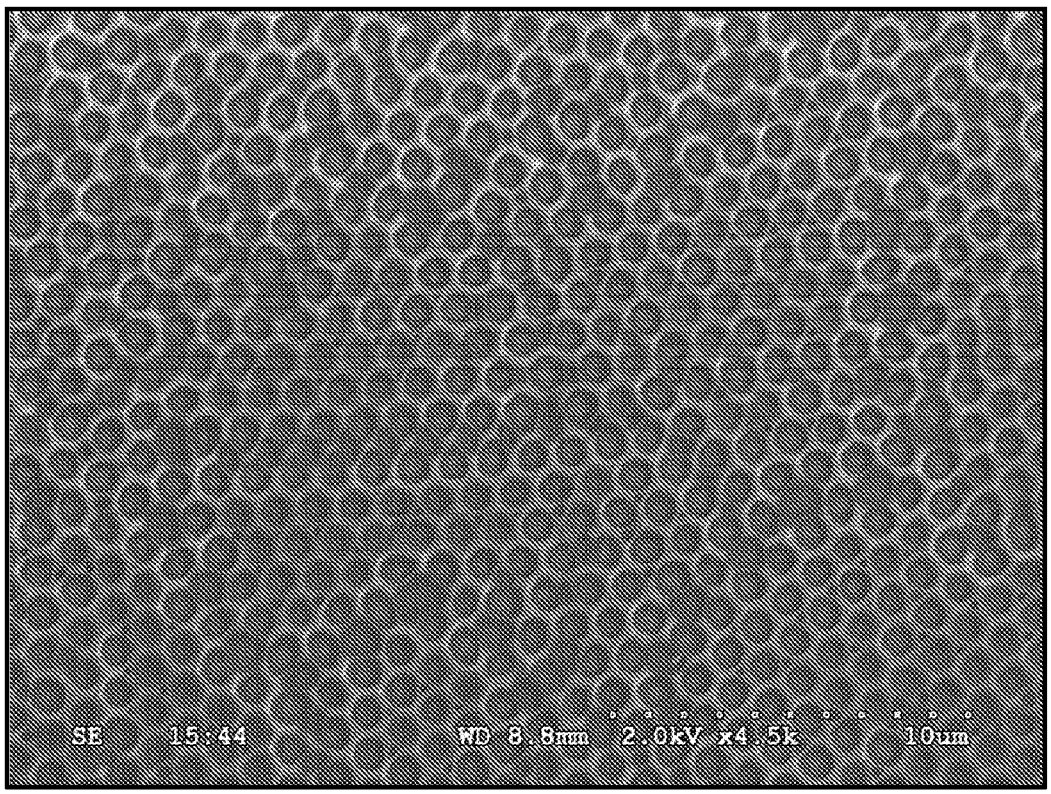
FIG. 28 shows SEM top view image of patterned PAA layer via microsphere lithography. The hole diameter is slightly smaller than 1 μm, which is the diameter of the beads that were assembled in a hexagonal closely pattern to create this pattern.

A SEM top view image of patterned PAA layer via microsphere lithography is shown in FIG. 28. The hole diameter is slightly smaller than 1 µm, which is the diameter of the beads that were assembled in a hexagonal closely pattern to create this pattern.

Figure 29:
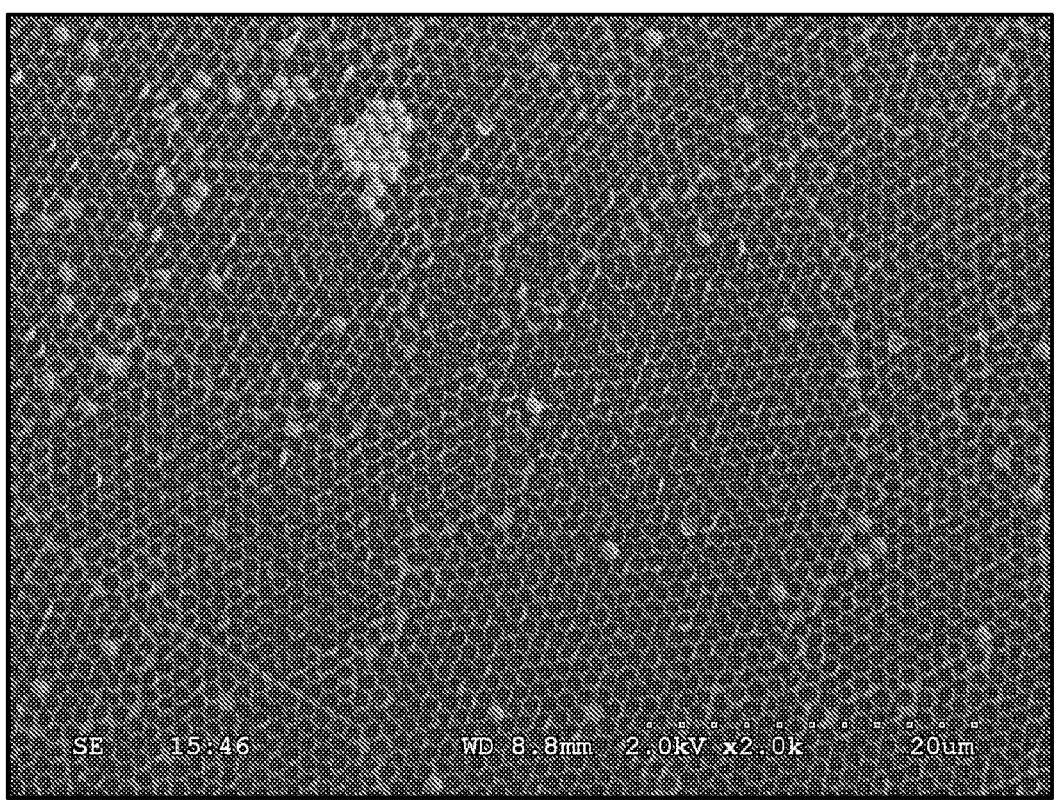
FIG. 29 shows a SEM top view image of patterned PAA layer coated with gold via microsphere lithography.

A SEM top view image of patterned PAA layer coated with gold via microsphere lithography is shown in FIG. 29.

Device Testing:

The devices were illuminated from the PMMA side with AM15 simulated sunlight (ABET Technologies Sun 2000, calibrated with NREL certified KG5 filtered Si reference diode) and then measured with a Keithley 2400 in forward and reverse bias voltage scan direction. The devices were not masked but the active area is defined well by the geometry of the fingers, which cover an area of 0.09 cm$^2$ per device.

Figure 16:
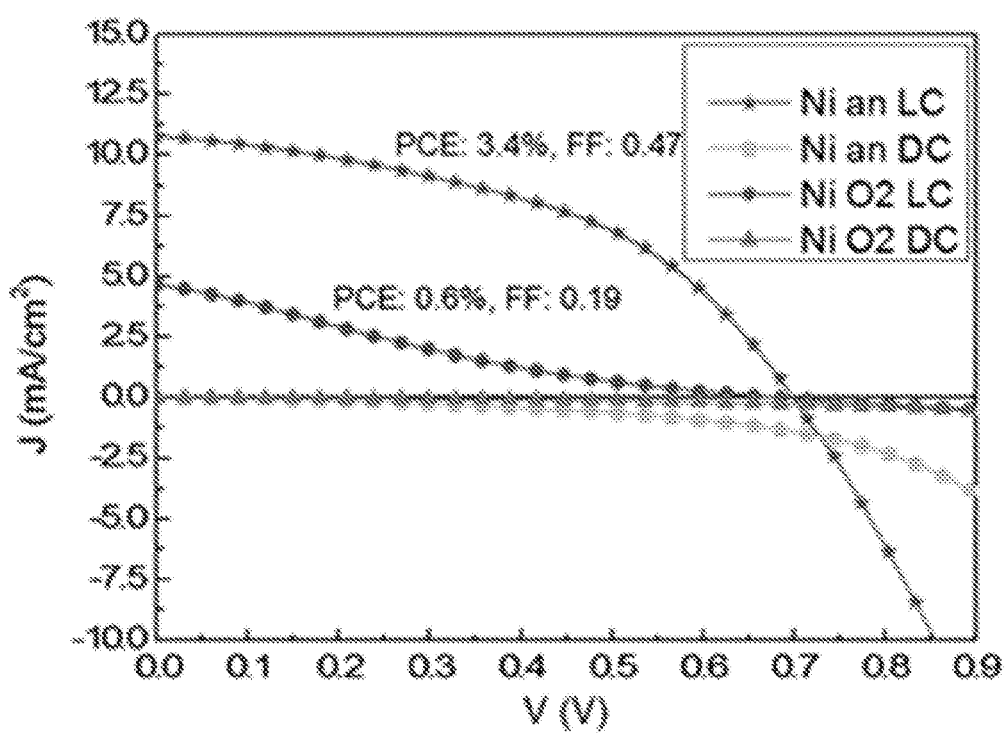
FIG. 16 shows current density-voltage (JV) characteristics under light (LC) and in the dark (DC) of devices, of which the Nickel electrodes were either annealed (an) or $O_2$ plasma etched to create a NiO shell.

FIG. 16 shows current density voltage (JV) characteristics under light (LC) and in the dark (DC) of devices, of which the Nickel electrodes were either annealed (an) or O$_2$ plasma etched to create a NiO shell.

Figure 18:
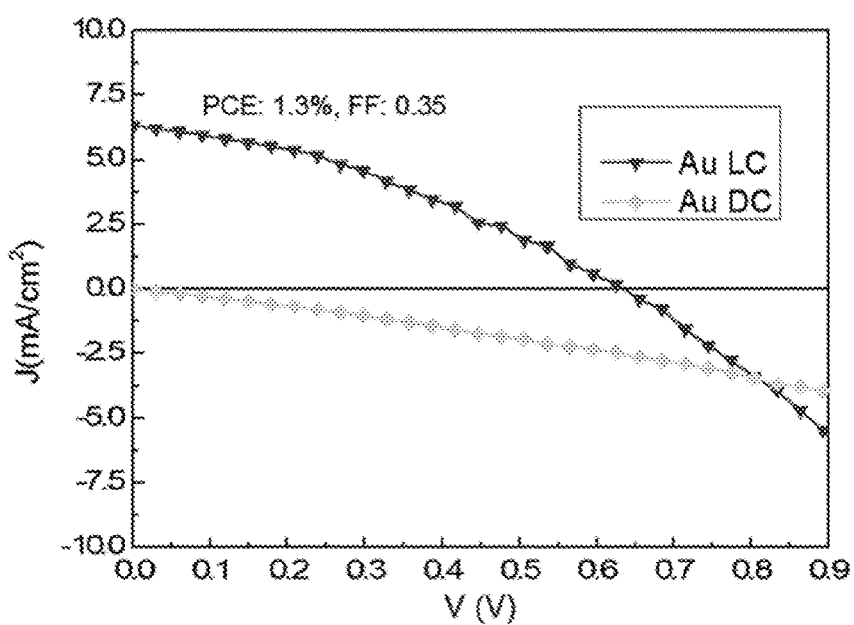
FIG. 18 shows current density voltage (JV) characteristics under light (LC) and in the dark (DC) of device, which uses Gold as the hole-conducting electrode, evaporated NiO as the hole transporting layer and 1-Dodecanethiol as a shunt blocking layer.

FIG. 18 shows current density voltage (JV) characteristics under light (LC) and in the dark (DC) of device, which uses Gold as the hole-conducting electrode, evaporated NiO as the hole transporting layer and 1-dodecanethiol as a shunt blocking layer.

Figure 19:
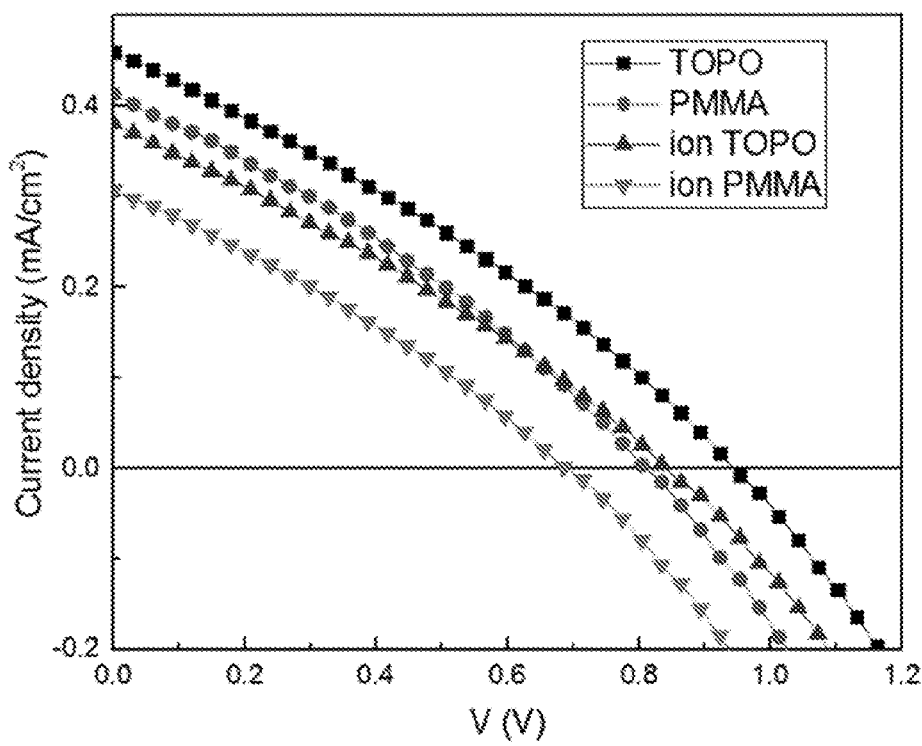
FIG. 19 shows current density-voltage (JV) characteristics under light of devices, which were untreated or treated with ionic liquid (ion) and/or the perovskite was coated with Trioctylphosphine oxide (TOPO). The open circuit voltage is shown to be improved upon TOPO treatment.

FIG. 19 shows current density voltage (JV) characteristics under light of devices, which were untreated or treated with ionic liquid (ion) and/or the perovskite was coated with Trioctylphosphine oxide (TOPO). The open circuit voltage is shown to be improved upon TOPO treatment.

Figure 20:
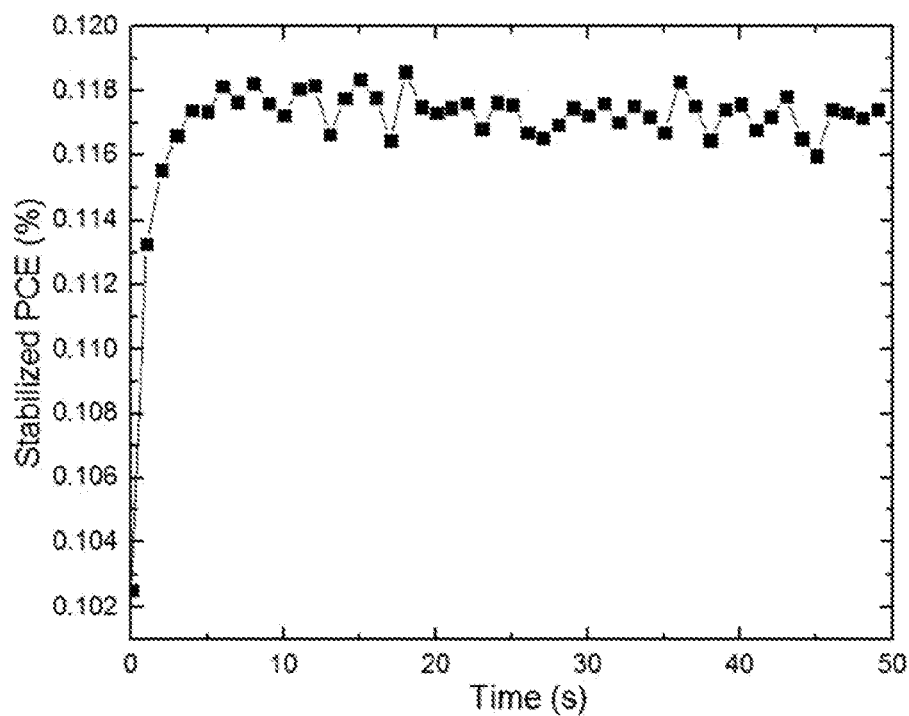
FIG. 20 shows stabilized power conversion efficiency (held at voltage of maximum power point for 50 seconds) of an ionic liquid and TOPO treated device.

FIG. 20 shows stabilized power conversion efficiency (held at voltage of maximum power point for 50 seconds) of an ionic liquid and TOPO treated device.

Figure 21:
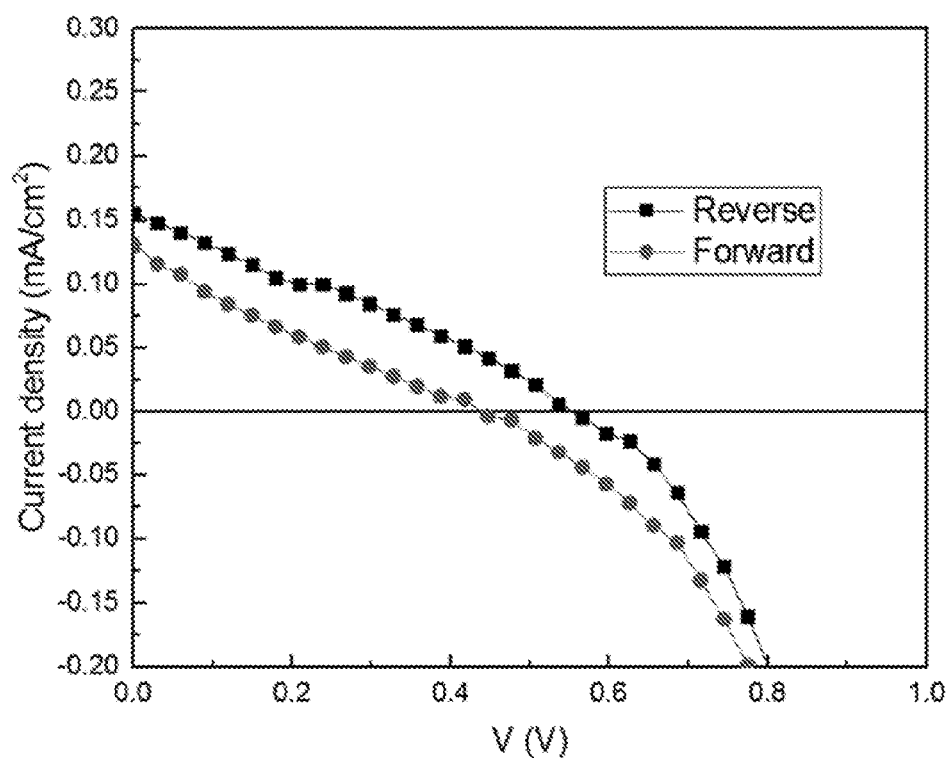
FIG. 21 shows current density-voltage (JV) characteristics in reverse and forward direction under light of devices which were inverted.

FIG. 21 shows current density-voltage (JV) characteristics in reverse and forward direction under light of devices which were inverted. The bottom electron transporting TiO$_2$ layer was replaced for a hole transporting NiO layer and the finger electrodes of Nickel were replaced with Titanium, which was annealed to create an electron transporting TiO$_2$ shell.

Figure 25:
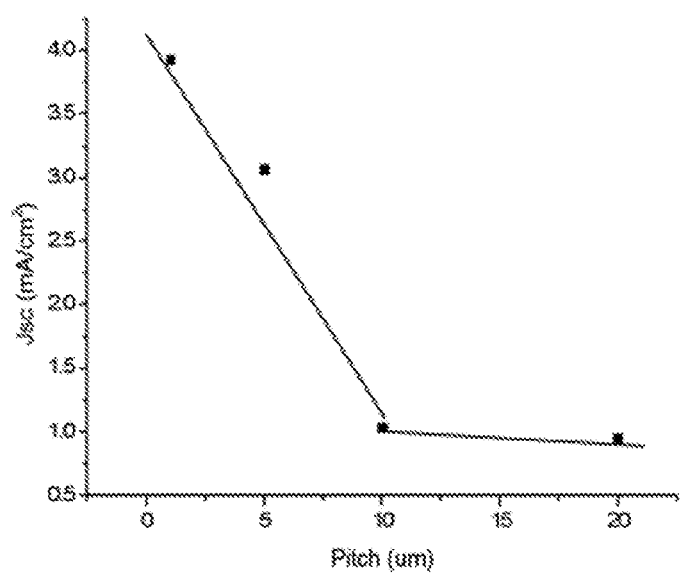
FIG. 25 shows short-circuit current measured under light for devices with finger pitch distances of 1 μm, 5 μm, 10 μm and 20 μm. The electron transporting layer used is spin-coated $TiO_2$.

FIG. 25 shows short-circuit current measured under light for devices with finger pitch distances of 1 µm, 5 µm, 10 µm and 20 µm. The electron transporting layer used is spin-coated TiO$_2$.

Figure 26:
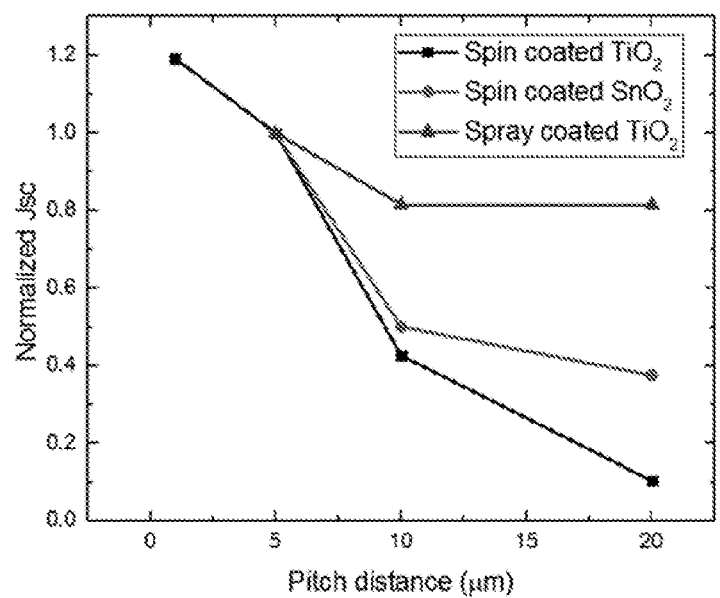
FIG. 26 shows short-circuit current measured under light for devices with electron transporting layers from spin-coated $TiO_2$, spin-coated $SnO_2$ and spray-coated $TiO_2$ with finger pitch distances of 1 μm (only spin-coated $TiO_2$), 5 μm, 10 μm and 20 μm (normalized to the Jsc at 5 μm). The electron transporting layer used is spin-coated $TiO_2$.

FIG. 26 shows short-circuit current measured under light for devices with electron transporting layers from spin-coated TiO$_2$, spin-coated SnO$_2$ and spray-coated TiO$_2$ with finger pitch distances of 1 µm (only spin-coated TiO$_2$), 5 µm, 10 µm and 20 µm (normalized to the J$_{SC}$ at 5 µm). The electron transporting layer used is spin-coated TiO$_2$.

The invention claimed is:

1. A process for producing a substrate comprising at least one first electrode comprising a first electrode material, and at least one second electrode comprising a second electrode material;
   wherein the substrate comprises:
   a layer of the first electrode material; and,
   disposed on the layer of the first electrode material, a layer of an insulating material, wherein the layer of the insulating material partially covers the layer of the first electrode material; and,
   disposed on the layer of the insulating material, the second electrode material, and wherein the process comprises:
   (i) providing the layer of the first electrode material disposed on a layer of a base material;
   (ii) disposing on the layer of the first electrode material a layer of a resist;
   (iii) performing a lithography step to define a second electrode pattern on the layer of the first electrode material;
   (iv) then depositing the layer of the insulating material on the layer of the resist with the second electrode pattern defined thereon;
   (v) disposing on the layer of the insulating material a layer of the second electrode material; and
   (vi) removing the resist and said insulating material and said second electrode material disposed on the resist.

2. A process according to claim 1, wherein the lithography step comprises an e-beam lithography step, an optical lithography step or a nanocontact printing step.

3. A process according to claim 1, wherein the resist is removed by exposing the resist to a solvent.

4. A process according to claim 1, wherein the process further comprises, between steps (iv) and (v), a step of disposing a layer of an adhesion material on the layer of the insulating material.

5. A process according to claim 1, wherein:
   step (v) comprises: (v-a) disposing, on the layer of the insulating material, a layer of a metal, and the process further comprises step (vii-a) of annealing the substrate to form a layer of metal oxide on the layer of the metal; or
   step (v) comprises (v-b) disposing, on the layer of the insulating material, a layer of a metal, and disposing, on the layer of the metal, a layer of a p-type semiconductor, and the process further comprises step (vii-b) of treating the substrate with a compound suitable for forming a self-assembled monolayer on exposed surfaces of the layer of the metal.

6. A process for producing an optoelectronic device, which process comprises:
   (a) producing a substrate comprising at least one first electrode comprising a first electrode material, and at least one second electrode comprising a second electrode material;
   wherein the substrate comprises:
   a layer of the first electrode material; and,
   disposed on the layer of the first electrode material, a layer of an insulating material, wherein the layer of an insulating material partially covers the layer of the first electrode material; and,
   disposed on the layer of the insulating material, the second electrode material, wherein the substrate is produced by a process comprising:

(i) providing the layer of the first electrode material disposed on a layer of a base material;
(ii) disposing on the layer of the first electrode material a layer of a resist;
(iii) performing a lithography step to define a second electrode pattern on the layer of the first electrode material;
(iv) then depositing the layer of the insulating material on the layer of the resist with the second electrode pattern defined thereon;
(v) disposing on the layer of the insulating material a layer of the second electrode material; and
(vi) removing the resist and said insulating material and said second electrode material disposed on the resist; and (b) disposing a layer of a photoactive material on the substrate.

7. A process for producing an optoelectronic device accordingly to claim 6, wherein the optoelectronic device is a photovoltaic device.

* * * * *